(12) United States Patent
Fan et al.

(10) Patent No.: US 11,855,661 B2
(45) Date of Patent: Dec. 26, 2023

(54) MULTIPLIER AND OPERATOR CIRCUIT

(71) Applicant: HUAWEI TECHNOLOGIES CO., LTD., Guangdong (CN)

(72) Inventors: Tuanbao Fan, Shanghai (CN); Yuexing Jiang, Shanghai (CN); Xiaoshan Shi, Shanghai (CN); Rongjun Wang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/750,299

(22) Filed: May 21, 2022

(65) Prior Publication Data

US 2022/0294468 A1 Sep. 15, 2022

Related U.S. Application Data

(63) Continuation of application No. PCT/CN2019/119993, filed on Nov. 21, 2019.

(51) Int. Cl.
*H03M 7/30* (2006.01)
*G06F 7/50* (2006.01)
*G06F 7/523* (2006.01)

(52) U.S. Cl.
CPC ............ *H03M 7/3066* (2013.01); *G06F 7/50* (2013.01); *G06F 7/523* (2013.01); *H03M 7/6011* (2013.01)

(58) Field of Classification Search
CPC .... H03M 7/30; H03M 7/3066; H03M 7/6011; G06F 7/50; G06F 7/523; G06F 7/501; G06F 7/5443
See application file for complete search history.

(56) References Cited

U.S. PATENT DOCUMENTS 3,978,323 A * 8/1976 Mecklenbrauker ......................... H04L 25/03146 708/306
4,153,938 A * 5/1979 Ghest .................... G06F 7/5338 708/625

(Continued)

FOREIGN PATENT DOCUMENTS

CN 107977191 A 5/2018
CN 110058840 A 7/2019

(Continued)

OTHER PUBLICATIONS

Wu Mei-qi et al.,"A design of multiplier based on modified Booth 4 algorithm and Wallace tree", Aug. 2019,total:6pages.

(Continued)

*Primary Examiner* — Lam T Mai
(74) *Attorney, Agent, or Firm* — Gregg L. Jansen

(57) ABSTRACT

A multiplier is configured to implement multiplication of a first value of M bits and a second value of N bits, and includes P groups of encoders and W layers of inversion compressors. Each group include N encoders and are configured to encode a part of bits in the second value, and a group selection signal and a symbol control input signal corresponding to the each group. The group selection signal and the symbol control input signal are generated based on a part of bits in the first value, and the P groups of encoders perform encoding to obtain P partial products. The W layers of inversion compressors are configured to compress the P partial products.

20 Claims, 15 Drawing Sheets

(56) References Cited

U.S. PATENT DOCUMENTS

| | | | |
|---|---|---|---|
| 4,730,340 A * | 3/1988 | Frazier, Jr. | H04B 1/7093 375/150 |
| 6,195,392 B1 * | 2/2001 | O'Grady | H04N 21/242 375/E7.278 |
| 6,877,022 B1 | 4/2005 | Toyonoh et al. | |
| 7,028,068 B1 | 4/2006 | Goveas et al. | |
| 7,529,302 B2 * | 5/2009 | Mukerjee | H04N 19/147 375/240.15 |
| 9,146,708 B2 * | 9/2015 | Moudgill | G06F 7/724 |
| 2011/0064214 A1 * | 3/2011 | Lablans | H03M 13/158 380/28 |
| 2012/0170738 A1 * | 7/2012 | Lablans | H04L 9/0631 380/28 |
| 2014/0055290 A1 * | 2/2014 | Lablans | H04L 9/06 341/51 |
| 2015/0193203 A1 | 7/2015 | Iyer et al. | |
| 2016/0283614 A1 | 9/2016 | Bae et al. | |

FOREIGN PATENT DOCUMENTS

| | | |
|---|---|---|
| EP | 0606611 A2 | 7/1994 |
| JP | 2004227248 A | 8/2004 |
| JP | 2009211481 A | 9/2009 |

OTHER PUBLICATIONS

Pooya Asadi et al.,"A New network multiplier using modified high order encoder and optimized hybrid adder in CMOS technology", Sep. 3, 2013,total:7pages.

* cited by examiner

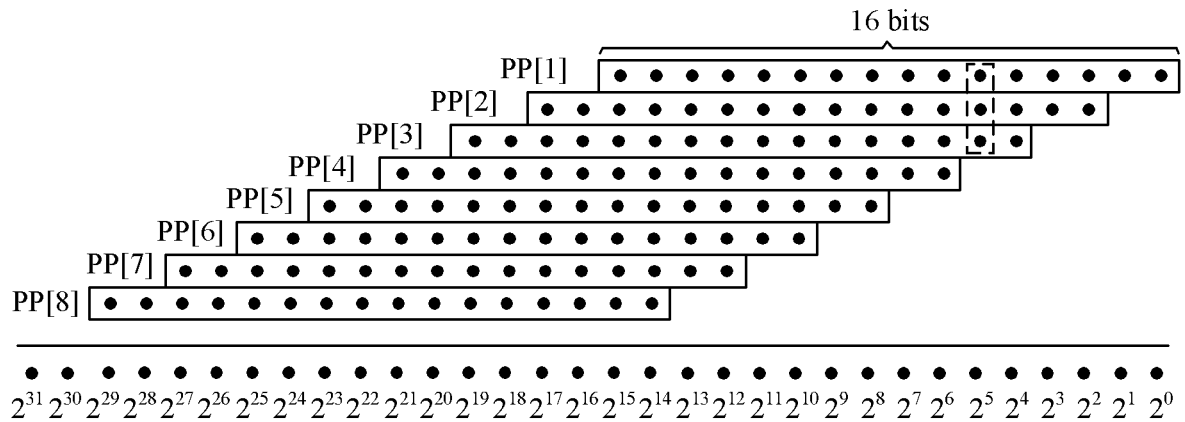

FIG. 6A

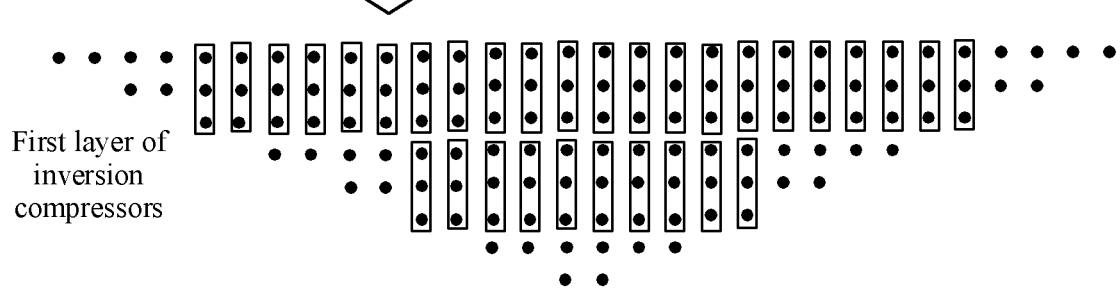

First layer of inversion compressors

FIG. 6B

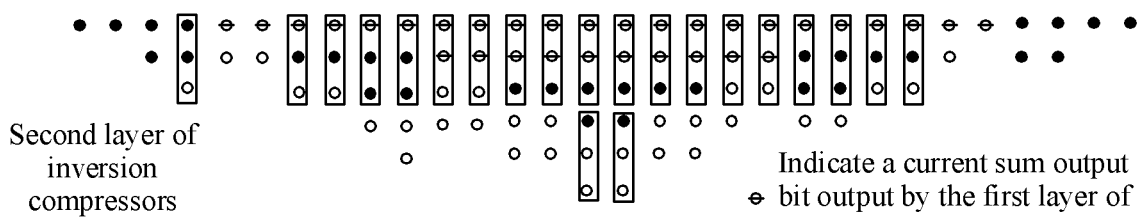

Second layer of inversion compressors

⊖ Indicate a current sum output bit output by the first layer of inversion compressors ○ Indicate a carry output bit output by the first layer of compressors

FIG. 6C

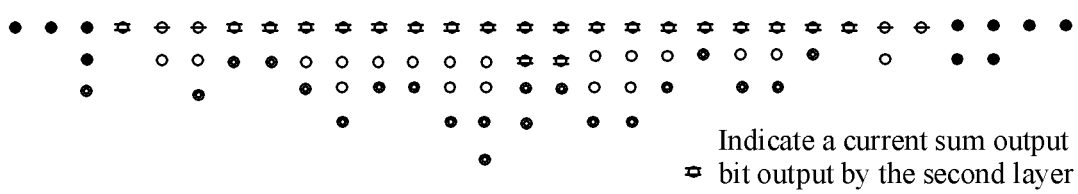

⊘ Indicate a current sum output bit output by the second layer of inversion compressors ● Indicate a carry output bit output by the second layer of compressors

MULTIPLIER AND OPERATOR CIRCUIT

CROSS-REFERENCE TO RELATED APPLICATIONS

This application is a continuation of International Application No. PCT/CN2019/119993, filed on Nov. 21, 2019, which is hereby incorporated by reference in its entirety.

TECHNICAL FIELD

This application relates to the field of electronic technologies, and in particular, to a multiplier and an operator circuit.

BACKGROUND

With continuous development and maturity of artificial intelligence (AI) technologies, AI technologies are gradually popularized in communication devices such as servers and terminals. The AI technologies have a high requirement on a computing capability of a processor, such as a central processing unit (CPU), a neural network processing unit (NPU), a graphics processing unit (GPU), or a digital signal processor (DSP) in communication devices. As a core computing unit of the processor, a multiplier plays an increasingly important role.

An architecture of an existing multiplier is designed based on a standard encoder and a standard adder. As shown in FIG. 1, an existing multiplier design may be summarized into three steps: (1) encoding a first value and a second value in a Radix-4 Booth encoder by using a Radix-4 Booth algorithm, to obtain partial products; (2) compressing the partial products by using a Wallace tree; and (3) summing two partial products obtained through compression, to obtain a multiplication operation result. FIG. 1 shows an example in which both the first value and the second value are 16-bit binary digits, and the multiplication operation result is a 32-bit binary digit, where a[15:0] indicates the first value, b[15:0] indicates the second value, and y[31:0] indicates the multiplication operation result. However, lots of standard encoders and standard adders are used in the foregoing multiplier implemented based on the Radix-4 Booth algorithm and the Wallace tree. In the standard encoder and the standard adder, there are a large quantity of metal-oxide-semiconductor (MOS) transistors, and areas of the transistors are large. As a result, an area of the multiplier is large. In other words, the design implementation of the existing multiplier is complex. Therefore, it is expected to design a multiplier that is easier to implement.

SUMMARY

This application provides a multiplier and an operator circuit, to reduce implementation difficulty of multipliers. To achieve the foregoing objectives, the following technical solutions are used in this application.

According to a first aspect, a multiplier is provided, configured to implement multiplication of a first value of M bits and a second value of N bits, where M and N are integers greater than 1. The multiplier includes P groups of encoders and W layers of inversion compressors. Each group of the P groups of encoders include N encoders, W is a positive integer, and P is an integer greater than 1. Each group of encoders are configured to encode a part of bits in the second value, and a group selection signal and a symbol control input signal corresponding to each group of encoders by using non-inversion encoding operators or inversion encoding operators, to obtain one partial product. The group selection signal and the symbol control input signal are generated based on a part of bits in the first value, and the P groups of encoders perform encoding to obtain P partial products. The W layers of inversion compressors are configured to compress the P partial products by using inversion compression operators to obtain two accumulated values, where a sum of the two accumulated values is a product of the first value and the second value. In the foregoing technical solution, the P groups of encoders perform encoding by using the non-inversion encoding operators or the inversion encoding operators, and the W layers of inversion compressors perform compression by using the inversion compression operators. This implementation solution is simple. For example, the solution has advantages of a small area and low power consumption, and therefore the multiplier has a small area and low power consumption.

In an implementation of the first aspect, each encoder of the N encoders corresponds to a first bit and a second bit in the second value, and the group selection signal includes a first signal and a second signal. Each encoder is configured to encode the first bit, the second bit, the group selection signal, and the symbol control input signal by using the non-inversion encoding operator or the inversion encoding operator, to obtain one output bit in one partial product. The first bit and the second bit may be two adjacent bits in the second value, or a same bit in the second value. In the foregoing implementation, an encoding manner of an encoder is provided, and an implementation solution of the encoding manner is simple. For example, an area of the encoder can be reduced.

In an implementation of the first aspect, when an encoder uses a non-inversion encoding operator, the encoder is a non-inversion encoder and is configured to perform the following encoding operation: If both the first signal and the first bit are 1, or both the second signal and the second bit are 1, the output bit obtained by the encoder is an inversion of the symbol control input signal. If at least one of the first signal and the first bit is 0, and at least one of the second signal and the second bit is 0, the output bit obtained by the encoder is the symbol control input signal. In the foregoing implementation, a non-inversion encoder is provided, and an implementation solution of the non-inversion encoder is simple, for example, a small area and low power consumption.

In an implementation of the first aspect, when an encoder uses an inversion encoding operator, the encoder is an inversion encoder and is configured to perform the following encoding operation: If both the first signal and the first bit are 1, or both the second signal and the second bit are 1, the output bit obtained by the encoder is the symbol control input signal. If at least one of the first signal and the first bit is 0, and at least one of the second signal and the second bit is 0, the output bit obtained by the encoder is an inversion of the symbol control input signal. In the foregoing implementation, an inversion encoder is provided, and an implementation solution of the inversion encoder is simple, for example, a small area and low power consumption.

In an implementation of the first aspect, W is 1, and the W layers of inversion compressors include a first layer of inversion compressors. The first layer of inversion compressors are configured to compress each digit weight in a matrix of the P partial products by using the inversion compression operators in a sequence from a low digit weight to a high digit weight until a quantity of remaining bits corresponding to each digit weight are less than three, to obtain a first compressed matrix. The first compressed matrix includes two rows, and each row corresponds to one accumulated value. Compression on each digit weight is performed for every three bits on the digit weight; and in the matrix of the P partial products, each row includes one partial product, and each column includes a plurality of bits corresponding to a same digit weight in the P partial products. In the foregoing implementation, the provided inversion compressor has high compression efficiency.

In an implementation of the first aspect, W is an integer greater than 1, and the W layers of inversion compressors include a first layer of inversion compressors to a $W^{th}$ layer of inversion compressors. The first layer of inversion compressors are configured to compress each digit weight in a matrix of the P partial products by using the inversion compression operators in a sequence from a low digit weight to a high digit weight until a quantity of remaining bits corresponding to each digit weight are less than three, to obtain a first compressed matrix. An $i^{th}$ layer of inversion compressors are configured to compress each digit weight in an $(i-1)^{th}$ compressed matrix by using the inversion compression operators in a sequence from a low digit weight to a high digit weight until a quantity of remaining bits corresponding to each digit weight are less than three, to obtain an $i^{th}$ compressed matrix, where a value of i ranges from 2 to W. A $W^{th}$ compressed matrix includes two rows, and each row corresponds to one accumulated value. Compression on each digit weight by each layer of inversion compressors is performed for the three bits on the digit weight. In the matrix of the P partial products, each row includes one partial product, and each column includes a plurality of bits corresponding to a same digit weight in the P partial products. In the foregoing implementation, the provided W layers of inversion compressors have high compression efficiency.

In an implementation of the first aspect, for every three bits on each digit weight, each inversion compressor is configured to perform the following compression: If the three bits are all 0, an output carry bit is 1, and a current output sum bit is 1. Alternatively, if the three bits are all 1, an output carry bit is 0, and a current output sum bit is 0. Alternatively, if one of the three bits is 1 and the other two bits are 0, an output carry bit is 1, and a current output sum bit is 0. Alternatively, if two of the three bits are 1 and the other bit is 0, an output carry bit is 0, and a current output sum bit is 1. The foregoing implementation provides a simple and effective compression manner of an inversion compressor.

In an implementation of the first aspect, phases of encoding operators used by encoders corresponding to a same digit weight are related to a phase of the current output sum bit or the output carry bit output by the inversion compressor. The encoder corresponding to the same digit weight is an encoder that performs encoding to obtain an output bit corresponding to the same digit weight, and an inversion compressor corresponding to the same digit weight is an inversion compressor that compresses the three bits on the same digit weight. The foregoing implementation provides a fast and effective manner of determining phases of encoding operators used by encoders.

In an implementation of the first aspect, the multiplier further includes one or more inverters, configured to: invert phases of a current output sum bit and an output carry bit output by one or more inversion compressors in the W layers of inversion compressors, or invert a phase of at least one of the three bits input to one or more inversion compressors. The foregoing implementation can ensure accuracy of a compression result, and improve compression efficiency of the W layers of inversion compressors.

In an implementation of the first aspect, the multiplier further includes a precoder, configured to: receive the first value, and generate the group selection signal and the symbol control input signal based on the part of bits in the first value.

In an implementation of the first aspect, the multiplier further includes an adder, configured to: receive the two accumulated values, and sum up the two accumulated values to obtain the product.

According to a second aspect, an operator circuit is provided, including a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, and a fifteenth transistor. The first transistor and the second transistor are coupled in parallel between a power supply terminal and a first node, the third transistor and the fourth transistor are coupled in parallel between the first node and a second node, the fifth transistor and the seventh transistor are coupled in series between the second node and a ground terminal, and the sixth transistor and the eighth transistor are coupled in series between the second node and the ground terminal. Control terminals of the third transistor and the fifth transistor are configured to receive a first input, control terminals of the first transistor and the sixth transistor are configured to receive a second input, control terminals of the fourth transistor and the seventh transistor are configured to receive a third input, and control terminals of the second transistor and the eighth transistor are configured to receive a fourth input. The ninth transistor is coupled between an inversion of a fifth input and an output terminal, and a control terminal of the ninth transistor is coupled to the second node. The tenth transistor is coupled between the second node and the output terminal, and a control terminal of the tenth transistor is coupled to the inversion of the fifth input. The eleventh transistor and the thirteenth transistor are coupled in series between the output terminal and the ground terminal. A control terminal of the eleventh transistor is coupled to the second node. A control terminal of the thirteenth transistor is configured to receive the inversion of the fifth input. The twelfth transistor is coupled between the output terminal and the second node, and a control terminal of the twelfth transistor is configured to receive the fifth input. The fourteenth transistor and the fifteenth transistor are coupled in series between the power supply terminal and the ground terminal, and a series coupled node between the fourteenth transistor and the fifteenth transistor is coupled to the inversion of the fifth input. Control terminals of the fourteenth transistor and the fifteenth transistor are configured to receive the fifth input. In the foregoing technical solution, a non-inversion encoding operator circuit is provided. The non-inversion encoding operator circuit has a small quantity of transistors, occupies a small area, and is simple for implementation. Therefore, an area of a multiplier can be reduced when the operator circuit is applied to the multiplier.

In an implementation of the second aspect, the first transistor, the second transistor, the third transistor, the fourth transistor, the ninth transistor, the tenth transistor, and the fourteenth transistor are P-type MOS (PMOS) transistors. The fifth transistor, the sixth transistor, the seventh transistor, the eighth transistor, the eleventh transistor, the twelfth transistor, the thirteenth transistor, and the fifteenth transistor are N-type MOS (NMOS) transistors. In the foregoing implementation, a toggle rate of the transistor is small when the provided operator circuit encodes data. Therefore, power consumption of a multiplier can be reduced when the operator circuit is applied to the multiplier.

According to a third aspect, an operator circuit is provided, including a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, and a fifteenth transistor. The first transistor and the second transistor are coupled in parallel between a power supply terminal and a first node, the third transistor and the fourth transistor are coupled in parallel between the first node and a second node, the fifth transistor and the seventh transistor are coupled in series between the second node and a ground terminal, and the sixth transistor and the eighth transistor are coupled in series between the second node and the ground terminal. Control terminals of the third transistor and the fifth transistor are configured to receive a first input, control terminals of the first transistor and the sixth transistor are configured to receive a second input, control terminals of the fourth transistor and the seventh transistor are configured to receive a third input, and control terminals of the second transistor and the eighth transistor are configured to receive a fourth input. The ninth transistor and the tenth transistor are coupled in series between the power supply terminal and an output terminal, a control terminal of the ninth transistor is coupled to an inversion of a fifth input, and a control terminal of the tenth transistor is coupled to the second node. The eleventh transistor is coupled between the second node and the output terminal, and a control terminal of the eleventh transistor is coupled to the fifth input. The twelfth transistor is coupled between the output terminal and the inversion of the fifth input, and a control terminal of the twelfth transistor is coupled to the second node. The thirteenth transistor is coupled between the output terminal and the second node, and a control terminal of the thirteenth transistor is coupled to the inversion of the fifth input. The fourteenth transistor and the fifteenth transistor are coupled in series between the power supply terminal and the ground terminal, and a series coupled node between the fourteenth transistor and the fifteenth transistor is coupled to the inversion of the fifth input. Control terminals of the fourteenth transistor and the fifteenth transistor are configured to receive the fifth input. In the foregoing technical solution, an inversion encoding operator circuit is provided. The inversion encoding operator circuit has a small quantity of transistors, occupies a small area, and is simple for implementation. Therefore, an area of a multiplier can be reduced when the operator circuit is applied to the multiplier.

In an implementation of the third aspect, the first transistor, the second transistor, the third transistor, the fourth transistor, the ninth transistor, the tenth transistor, the eleventh transistor, and the fourteenth transistor are PMOS transistors. The fifth transistor, the sixth transistor, the seventh transistor, the eighth transistor, the twelfth transistor, the thirteenth transistor, and the fifteenth transistor are NMOS transistors. In the foregoing implementation, a toggle rate of the transistor is small when the provided operator circuit encodes data. Therefore, power consumption of a multiplier can be reduced when the operator circuit is applied to the multiplier.

According to a fourth aspect, an operator circuit is provided, including a first transistor, a second transistor, a third transistor, a fourth transistor, a fifth transistor, a sixth transistor, a seventh transistor, an eighth transistor, a ninth transistor, a tenth transistor, an eleventh transistor, a twelfth transistor, a thirteenth transistor, a fourteenth transistor, a fifteenth transistor, a sixteenth transistor, a seventeenth transistor, an eighteenth transistor, a nineteenth transistor, a twentieth transistor, a twenty-first transistor, and a twenty-second transistor. The first transistor and the second transistor are coupled in parallel between a power supply terminal and a first node, the third transistor is coupled between the first node and a first output terminal, and the fourth transistor is coupled between the first output terminal and a second node. The fifth transistor and the sixth transistor are coupled in parallel between the second node and a ground terminal, the seventh transistor is coupled between the power supply terminal and a third node, the eighth transistor is coupled between the third node and the first output terminal, and the ninth transistor is coupled between the first output terminal and a fourth node. The tenth transistor is coupled between the fourth node and the ground terminal, the eleventh transistor and the twelfth transistor are coupled in series between the third node and a second output terminal, and the thirteenth transistor and the fourteenth transistor are coupled in series between the second output terminal and the fourth node. The fifteenth transistor, the sixteenth transistor, and the seventeenth transistor are coupled in parallel between the power supply terminal and a fifth node, the eighteenth transistor is coupled between the fifth node and the second output terminal, the nineteenth transistor is coupled between the second output terminal and a sixth node, and the twentieth transistor, the twenty-first transistor, and the twenty-second transistor are coupled in parallel between the sixth node and the ground terminal. Control terminals of the third transistor, the fourth transistor, the twelfth transistor, the thirteenth transistor, the fifteenth transistor, and the twentieth transistor are configured to receive a first input. Control terminals of the first transistor, the fifth transistor, the seventh transistor, the tenth transistor, the sixteenth transistor, and the twenty-first transistor are configured to receive a second input. Control terminals of the second transistor, the sixth transistor, the eighth transistor, the ninth transistor, the eleventh transistor, the fourteenth transistor, the seventeenth transistor, and the twenty-second transistor are configured to receive a third input. Control terminals of the eighteenth transistor and the nineteenth transistor are coupled to the first output terminal. In the foregoing technical solution, an inversion compression operator circuit is provided. The inversion compression operator circuit has a small quantity of transistors, occupies a small area, and is simple for implementation. Therefore, an area of a multiplier can be reduced when the operator circuit is applied to the multiplier.

In an implementation of the fourth aspect, the first transistor, the second transistor, the third transistor, the seventh transistor, the eighth transistor, the eleventh transistor, the twelfth transistor, the fifteenth transistor, the sixteenth transistor, the seventeenth transistor, and the eighteenth transistor are PMOS transistors. The fourth transistor, the fifth transistor, the sixth transistor, the ninth transistor, the tenth transistor, the thirteenth transistor, the fourteenth transistor, the nineteenth transistor, the twentieth transistor, the twenty-first transistor, and the twenty-second transistor are NMOS transistors. In the foregoing implementation, a toggle rate of the transistor is small when the provided operator circuit compresses data. Therefore, power consumption of a multiplier can be reduced when the operator circuit is applied to the multiplier.

According to a fifth aspect, a processor is provided, including a multiplier or an operator circuit. The multiplier is the multiplier provided in any one of the first aspect or the implementations of the first aspect, and the operator circuit is the operator circuit provided in any one of the second aspect to the fourth aspect or the implementations of the second aspect to the fourth aspect. Optionally, the processor includes a neural network processing unit.

According to a sixth aspect, a chip is provided, including a multiplier or an operator circuit. The multiplier is the multiplier provided in any one of the first aspect or the implementations of the first aspect, and the operator circuit is the operator circuit provided in any one of the second aspect to the fourth aspect or the implementations of the second aspect to the fourth aspect.

It may be understood that any processor or chip provided above includes the multiplier or operator circuit provided above. Therefore, for beneficial effects that can be achieved by the processor or chip, refer to beneficial effects of the multiplier or operator circuit provided above. Details are not described herein again.

BRIEF DESCRIPTION OF DRAWINGS

FIG. 6A to FIG. 6D are a diagram of a compression example of W layers of inversion compressors according to an embodiment of this application;

DESCRIPTION OF EMBODIMENTS

In this application, "at least one" means one or more, and "a plurality of" means two or more. The term "and/or" describes an association relationship for describing associated objects and represents that three relationships may exist. For example, A and/or B may indicate the following cases: Only A exists, both A and B exist, and only B exists, where A and B may be singular or plural. At least one of the following items (pieces) or a similar expression thereof indicates any combination of these items, including a single item (piece) or any combination of a plurality of items (pieces). For example, at least one (pieces) of a, b, or c may indicate: a; b; c; a and b; a and c; b and c; or a, b, and c; where a, b, and c may be singular or plural. In addition, in the embodiments of this application, words such as "first" and "second" are used to distinguish between objects that have basically similar names, functions or purposes. A person skilled in the art may understand that words such as "first" and "second" do not limit a quantity or an execution sequence. The term "coupling" is used to indicate an electrical connection, including direct connection through a wire or connection end or indirect connection through another device. "Coupling" should therefore be regarded as an electronic communication connection in a broad sense.

Figure 1:
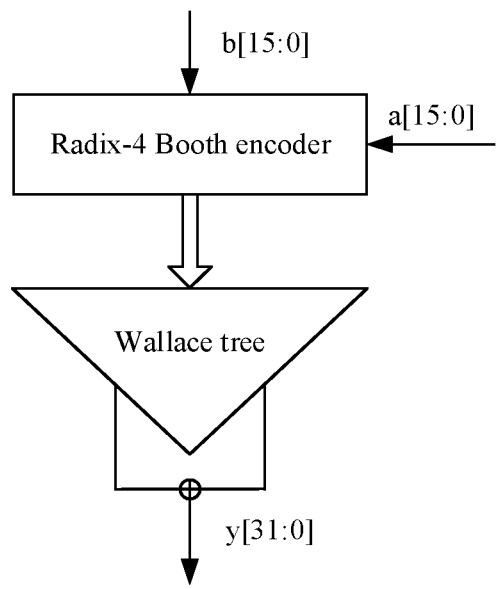
FIG. 1 is a diagram of an architecture of a multiplier according to the conventional technology.
Figure 2:
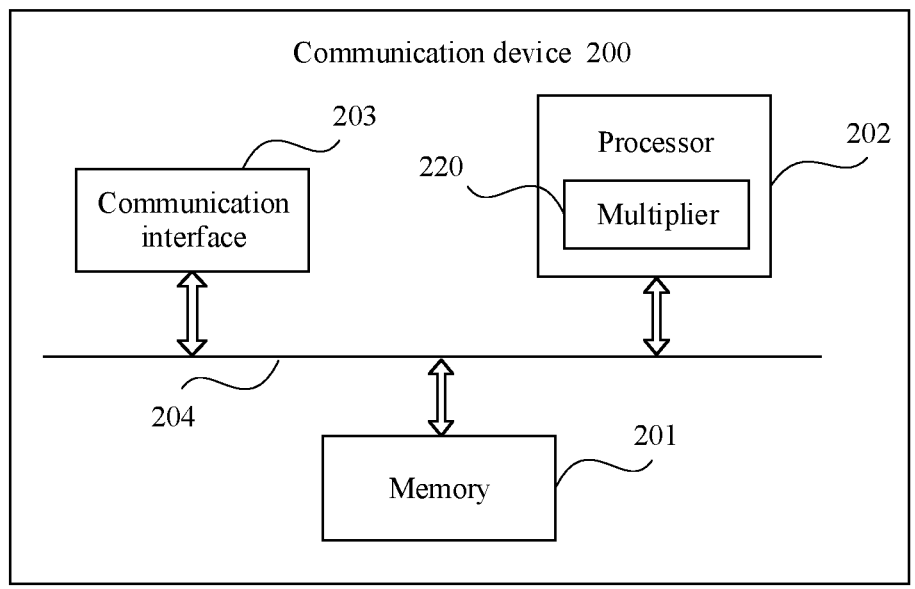
FIG. 2 is a diagram of a communication device according to an embodiment of this application.

FIG. 2 is a diagram of a structure of a communication device 200 according to an embodiment of this application. The communication device 200 may be a terminal, a server, or the like. As shown in FIG. 2, the communication device 200 may include a memory 201, a processor 202, a communication interface 203, and a bus 204. The memory 201, the processor 202, and the communication interface 203 are connected to each other through the bus 204. The memory 201 is configured to store data, a software program, and a module, and mainly includes a program storage area and a data storage area. The program storage area may store an operating system, an application program required for at least one function, and the like. The data storage area may store data created during the device is used, and the like. The processor 202 is configured to control and manage an action of the communication device, for example, perform various functions of the device and process data by running or executing a software program and/or a module stored in the memory 201 and by invoking data stored in the memory 201. The communication interface 203 is configured to support communication of the device.

The processor 202 includes but is not limited to a central processing unit (CPU), a network processing unit (NPU), a graphics processing unit (GPU), a digital signal processor (DSP), a general purpose processor, or the like. The processor 202 includes one or more multipliers, for example, includes a multiplier matrix. The multiplier is a component that implements a multiplication operation in the processor 202.

The bus 204 may be a peripheral component interconnect (PCI) bus, an extended industry standard architecture (EISA) bus, or the like. The bus may be classified into an address bus, a data bus, a control bus, and the like. For ease of representation, only one thick line is used to represent the bus in FIG. 2, but this does not mean that there is only one bus or only one type of bus.

Figure 3:
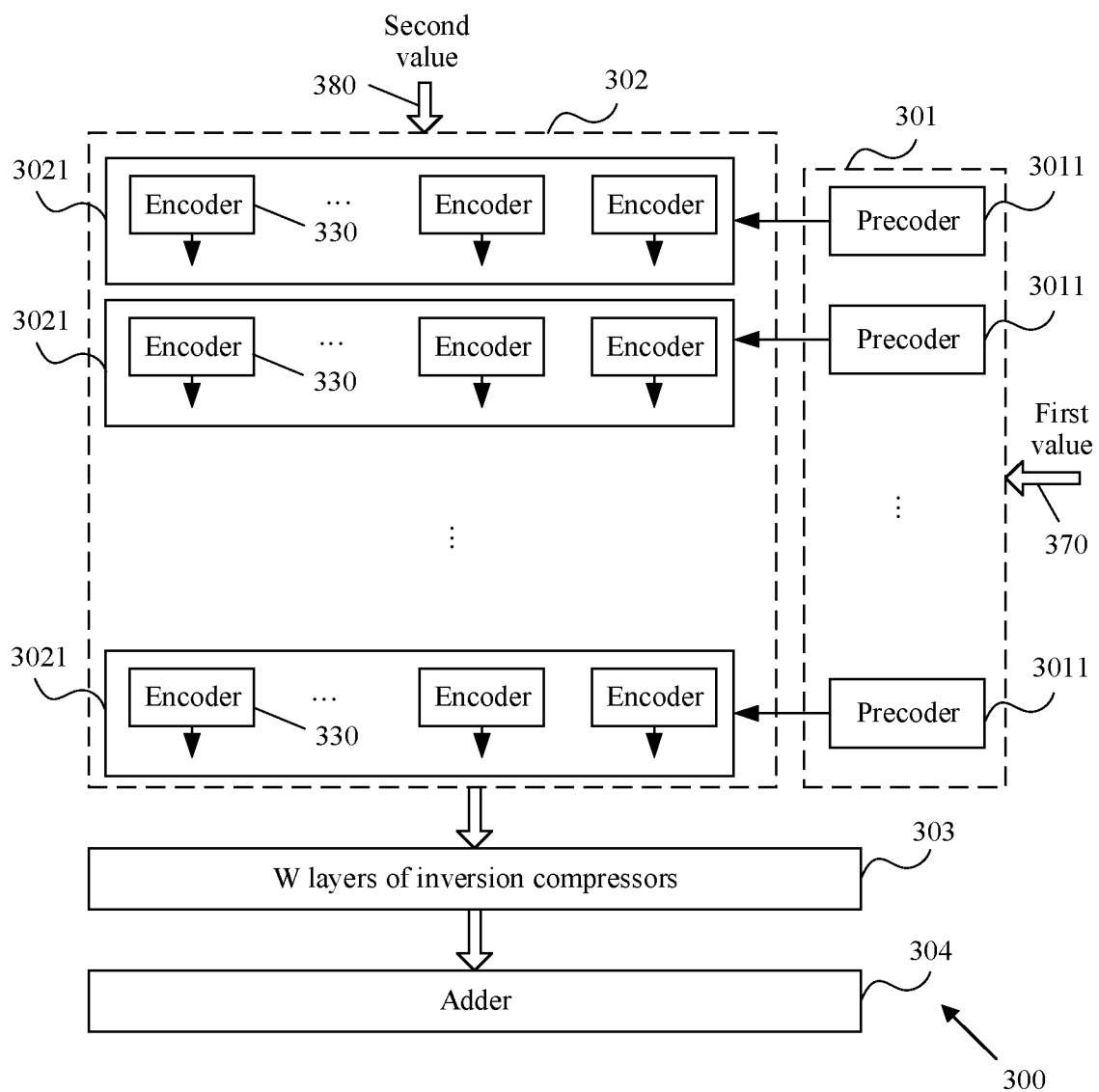
FIG. 3 is a diagram of a multiplier according to an embodiment of this application.

To further describe the technical solutions, FIG. 3 is a diagram of a multiplier 300 according to an embodiment of this application. The multiplier 300 is configured to implement multiplication of a first value 370 of M bits and a second value 380 of N bits, where M and N are integers greater than 1. The multiplier 300 includes P precoders 301, P groups of encoders 302, W layers of inversion compressors 303, and an adder 304. Each group of encoders 3021 in the P groups of encoders 302 include N encoders, W is a positive integer, and P is an integer greater than 1. Compared with a conventional design, the multiplier is easy to implement, and is described in detail below.

Each precoder 3011 in the P precoders 301 is configured to generate a group selection signal and a symbol control input signal based on a part of bits in a first value, so that the P precoders 301 accordingly generate P group selection signals and P symbol control input signals. The P group selection signals and the P symbol control input signals are in a one-to-one correspondence with the P groups of encoders. In other words, one group selection signal and one symbol control input signal correspond to one group of encoders. The group selection signal may be generated based on two or three adjacent bits in the first value. The symbol control input signal may be one bit in the first value, or may be generated based on two or three adjacent bits in the first value.

For example, if the first value is a 4-bit binary digit and is denoted as a[3:0], and P is equal to 2, two precoders may generate two group selection signals and two symbol control input signals based on a[3:0]. In the two group selection signals, a first group selection signal may be generated based on a[0] and a[1], and a second group selection signal may be generated based on a[1] to a[3]. In the two symbol control input signals, a first symbol control input signal may be a[1], and a second symbol control input signal may be a[3]. a[i] indicates an $i^{th}$ bit from right to left in a[3:0], and a value of i ranges from 0 to 3.

Each group of encoders 3021 are configured to encode the second value, and a group selection signal and a symbol control input signal corresponding to the group of encoders 3021 using non-inversion encoding operators or inversion encoding operators to obtain one partial product. The P groups of encoders 3021 perform encoding to obtain P partial products.

Each group of encoders 3021 include N encoders, each encoder 330 of the N encoders corresponds to a first bit and a second bit in the second value, and the group selection signal includes a first signal and a second signal. Each encoder 330 is configured to encode the first bit, the second bit, the group selection signal, and the symbol control input signal by using the non-inversion encoding operator or the inversion encoding operator, to obtain one output bit in one partial product. N encoders 330 in each group of encoders 3021 each perform encoding to obtain N output bits in one partial product, that is, obtain the partial product. The first bit and the second bit may be two adjacent bits in the second value, or a same bit in the second value. The following embodiments may describe this in detail.

For example, if the second value is a 3-bit binary digit and is denoted as b[2:0], and N is equal to 3, each group of encoders 3021 include three encoders 330. Among the three encoders, a first encoder 330 corresponds to two adjacent bits b[0] and b[1] in b[2:0], a second encoder 330 corresponds to two adjacent bits b[1] and b[2] in b[2:0], and both a first bit and a second bit corresponding to a third encoder are b[2] in b[2:0], that is, only one bit b[2] is input into the last third encoder 330 as both the first bit and the second bit. b[i] indicates an $i^{th}$ bit from right to left in b[2:0].

The foregoing example in which the first value is a[3:0] and the second value is b[2:0] is used as an example: if a first encoder 330 in a first group of encoders 3021 corresponds to the two adjacent bits b[0] and b[1] in the second value b[2:0], a corresponding group selection signal is a first group selection signal (denoted as A and B) generated based on a[0] and a[1], and a corresponding symbol control input signal is a[1], the first encoder may be configured to encode b[0], b[1], A, B, and a[1] by using a non-inversion encoding operator or an inversion encoding operator to obtain one output bit in a first partial product.

When an encoder 330 uses a non-inversion encoding operator, the encoder 330 may be referred to as a non-inversion encoder. When an encoder 330 uses an inversion encoding operator, the encoder 330 may be referred to as an inversion encoder. The following separately describes the non-inversion encoder and the inversion encoder in detail.

The non-inversion encoder is configured to perform the following encoding operation: if both the first signal and the first bit are 1, or both the second signal and the second bit are 1, an output bit obtained by the non-inversion encoder is an inversion of the symbol control input signal. Alternatively, if at least one of the first signal and the first bit is 0, and at least one of the second signal and the second bit is 0, an output bit obtained by the non-inversion encoder is the symbol control input signal.

Figure 4:
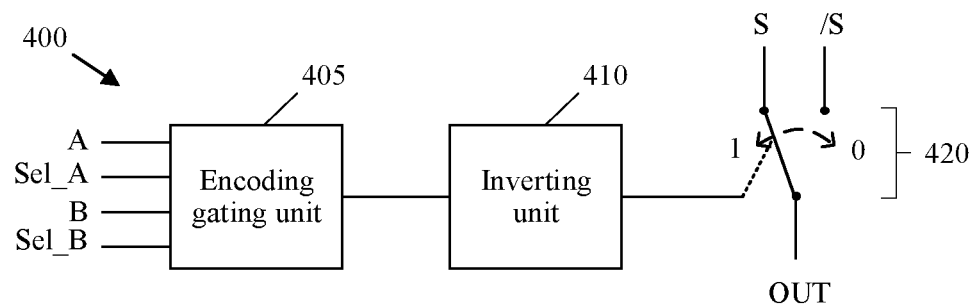
FIG. 4 is a logical block diagram of a non-inversion encoder according to an embodiment of this application.

FIG. 4 is a logical block diagram of a non-inversion encoder 400 according to an embodiment of this application. The logical block diagram includes an encoding gating unit 405, an inverting unit 410, and a switch control unit 420. A function of the encoding gating unit 405 is output 1 if A and Sel_A are both 1, or if B and Sel_B are both 1; otherwise, output 0. A function of the inverting unit 410 is to perform inversion on an output of the encoding gating unit 405. A function of the switch control unit 420 is: output S if an output of the inverting unit 410 is 1, or output /S if an output of the inverting unit 410 is 0. In FIG. 4, A represents the first signal, B represents the second signal, Sel_A represents the first bit, Sel_B represents the second bit, S represents the symbol control input signal, /S represents the inversion of the symbol control input signal, and OUT represents the output bit.

The non-inversion encoder may perform encoding based on a logical table shown in the following Table 1, where x in Table 1 represents any one of "0" or "1", and A, B, Sel_A, Sel_B, S, and OUT are consistent with A, B, Sel_A, Sel_B, S, and OUT in FIG. 4.

TABLE 1

| A | Sel_A | B | Sel_B | S | OUT |
|---|---|---|---|---|---|
| 1 | 1 | x | x | 0 | 1 |
| 1 | 1 | x | x | 1 | 0 |
| x | x | 1 | 1 | 0 | 1 |
| x | x | 1 | 1 | 1 | 0 |
| 0 | x | 0 | x | 0 | 0 |
| 0 | x | 0 | x | 1 | 1 |
| x | 0 | x | 0 | 0 | 0 |
| x | 0 | x | 0 | 1 | 1 |

The inversion encoder is configured to perform the following encoding operation: if both the first signal and the first bit are 1, or both the second signal and the second bit are 1, an output bit obtained by the inversion encoder is the symbol control input signal. Alternatively, if at least one of the first signal and the first bit is 0, and at least one of the second signal and the second bit is 0, an output bit obtained by the inversion encoder is an inversion of the symbol control input signal.

Figure 5:
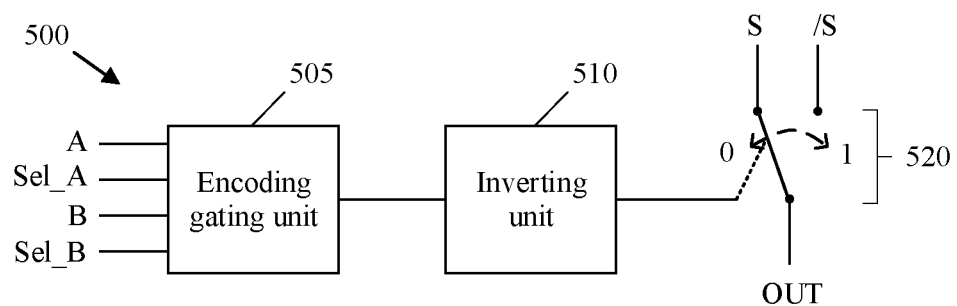
FIG. 5 is a logical block diagram of an inversion encoder according to an embodiment of this application.

FIG. 5 is a logical block diagram of an inversion encoder 500 according to an embodiment of this application. The logical block diagram includes an encoding gating unit 505, an inverting unit 510, and a switch control unit. A function of the encoding gating unit 505 is output 1 if A and Sel_A are both 1, or if B and Sel_B are both 1; otherwise, output 0. A function of the inverting unit 510 is perform inversion on an output of the encoding gating unit 505. A function of the switch control unit is: output S if an output of the inverting unit 510 is 0, or output /S if an output of the inverting unit 510 is 1. In FIG. 5, A represents the first signal, B represents the second signal, Sel_A represents the first bit, Sel_B represents the second bit, S represents the symbol control input signal, /S represents the inversion of the symbol control input signal, and OUT represents the output bit.

In other words, the inversion encoder may perform encoding based on a logical table shown in the following Table 2, where x in Table 2 represents any one of "0" or "1", and A, B, Sel_A, Sel_B, S, and OUT are consistent with A, B, Sel_A, Sel_B, S, and OUT in FIG. 5.

TABLE 2

| A | Sel_A | B | Sel_B | S | OUT |
|---|---|---|---|---|---|
| 1 | 1 | x | x | 0 | 0 |
| 1 | 1 | x | x | 1 | 1 |
| x | x | 1 | 1 | 0 | 0 |
| x | x | 1 | 1 | 1 | 1 |
| 0 | x | 0 | x | 0 | 1 |
| 0 | x | 0 | x | 1 | 0 |
| x | 0 | x | 0 | 0 | 1 |
| x | 0 | x | 0 | 1 | 0 |

The W layers of inversion compressors 303 are configured to compress the P partial products by using inversion compression operators to obtain two accumulated values.

When W is 1, the W layers of inversion compressors 303 include a first layer of inversion compressors configured to compress each digit weight in a matrix of the P partial products by using the inversion compression operators in a sequence from a low digit weight to a high digit weight, until a quantity of remaining bits corresponding to each digit weight are less than three, to obtain a first compressed matrix including two rows, where each row corresponds to one accumulated value. When W is an integer greater than 1, the W layers of inversion compressors 303 include a first layer of inversion compressors to a $W^{th}$ layer of inversion compressors. The first layer of inversion compressors are configured to compress each digit weight in a matrix of the P partial products by using the inversion compression operators in a sequence from a low digit weight to a high digit weight until a quantity of remaining bits corresponding to each digit weight are less than three, to obtain a first compressed matrix. An $i^{th}$ layer of inversion compressors are configured to compress each digit weight in an $(i-1)^{th}$ compressed matrix by using the inversion compression operators in a sequence from a low digit weight to a high digit weight until a quantity of remaining bits corresponding to each digit weight are less than three, to obtain an $i^{th}$ compressed matrix, where a value of i ranges from 2 to W. A $W^{th}$ compressed matrix includes two rows, and each row corresponds to one accumulated value.

Compression on each digit weight by each layer of inversion compressors is performed for three bits on the digit weight, and an output carry bit and a current sum bit that are obtained through compression by the layer of inversion compressors are not compressed. In the matrix of the P partial products, each row includes one partial product, each column includes a plurality of bits corresponding to a same digit weight in the P partial products, and compression on each digit weight is performed for the three bits on the digit weight.

For example, it is assumed that the P groups of encoders perform encoding to obtain eight partial products, and each partial product includes 16 bits. In this case, a matrix of the eight partial products may be shown in FIG. 6A, where PP[1] to PP[8] represent the eight partial products, and $2^0$, $2^1$, $2^2$, ..., and $2^{32}$ indicate different digit weights. The digit weight is for an output result of the W layers of inversion compressors. Similar to one-bit, ten-bit, or hundred-bit in the decimal system, the digit weight is used to indicate one bit in a binary value of the output result. For example, if an output result of the W layers of inversion compressors is a 32-bit binary value, the output result includes 32 digit weights. In opposite to the digit weight, a bit corresponds to 0 or 1, indicating one piece of binary information. It may be considered that one digit weight is one bit in an output result of the W layers of inversion compressors.

For ease of understanding, as shown in FIG. 6B, converted from FIG. 6A, a compression process of each layer of the W layers of inversion compressors 303 is described by using an example. An output result includes 32 digit weights, and a first layer of inversion compressors are configured to compress every three bits and reserve bits whose quantity is less than three for bits corresponding to each digit weight of $2^4$ to $2^{29}$ in the matrix, and reserve bits whose quantity is less than three for bits corresponding to other digit weights other than $2^4$ to $2^{29}$. Each solid rectangular box in FIG. 6B may be used to represent one inversion compressor in the first layer of inversion compressors. A first compressed matrix obtained through compression by the first layer of inversion compressors is shown in FIG. 6C. In the figure, ⊖ indicates a current output sum bit output by the first layers of inversion compressors, and ○ indicates an output carry bit output by the first layer of inversion compressors. A second layer of inversion compressors is configured to compress every three bits and reserve bits whose quantity is less than three for bits corresponding to each digit weight of $2^6$ to $2^{23}$ and $2^{26}$ in the first compressed matrix, and reserve bits whose quantity is less than three for bits corresponding to other digit weights other than $2^6$ to $2^{23}$ and $2^{26}$. Each rectangular box in FIG. 6C may be used to represent one inversion compressor in the second layer of inversion compressors. A second compressed matrix obtained through compression by the second layer of inversion compressors is shown in FIG. 6D. In the figure, ⊖ indicates a current output sum bit output by the second layer of inversion compressors, and ⊙ indicates an output carry bit output by the second layer of inversion compressors. Subsequent compression processes of a third layer of inversion compressors to a $W^{th}$ layer of inversion compressors are similar to the compression processes of the first layer of inversion compressors and the second layer of inversion compressors. Details are not described herein again in this embodiment of this application.

For every three bits on each digit weight, each inversion compressor is configured to perform the following compression: if the three bits are all 0, an output carry bit is 1, and a current output sum bit is 1; if the three bits are all 1, an output carry bit is 0, and a current output sum bit is 0; if one of the three bits is 1 and the other two bits are 0, an output carry bit is 1, and a current output sum bit is 0; or if two of the three bits are 1 and the other bit is 0, an output carry bit is 0, and a current output sum bit is 1.

The output carry bit is an output bit pointing to a next digit weight of a current compressed digit weight, and the current output sum bit is an output bit obtained through compression of the current compressed digit weight. For example, it is assumed that a current compressed digit weight is $2^5$, and a next digit weight of the current compressed digit weight is $2^6$. If three bits on $2^5$ are all 0, a single 1 is generated through compression on $2^5$, and a single 1 is generated on $2^6$.

Figure 7:
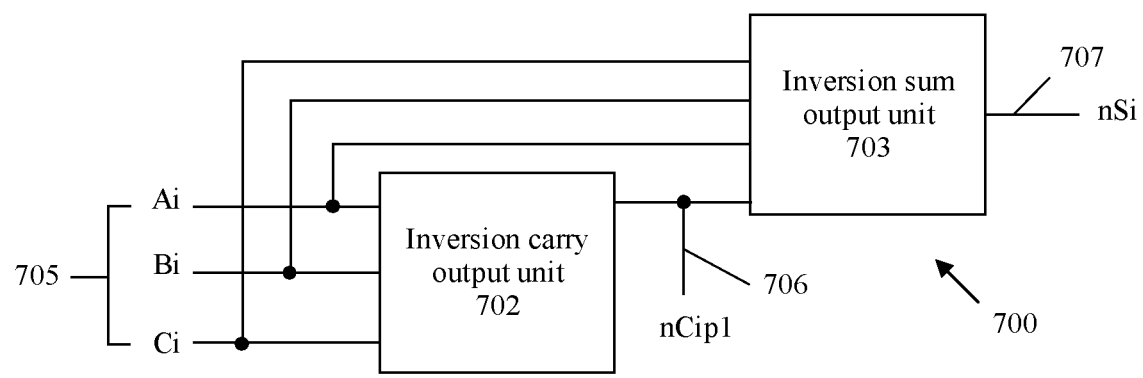
FIG. 7 is a logical block diagram of an inversion compressor according to an embodiment of this application.
Figure 8A:
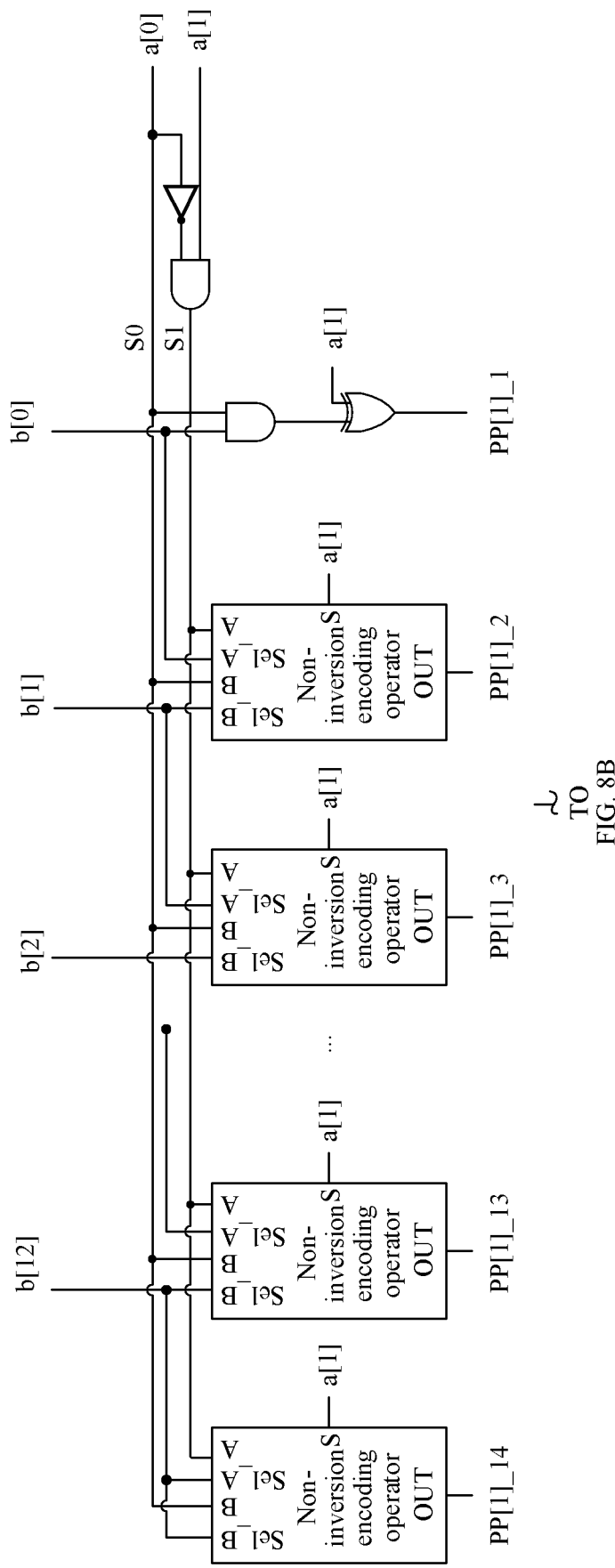
FIG. 8A to FIG. 8F are an example diagram of precoders and encoders according to an embodiment of this application.
Figure 8B:
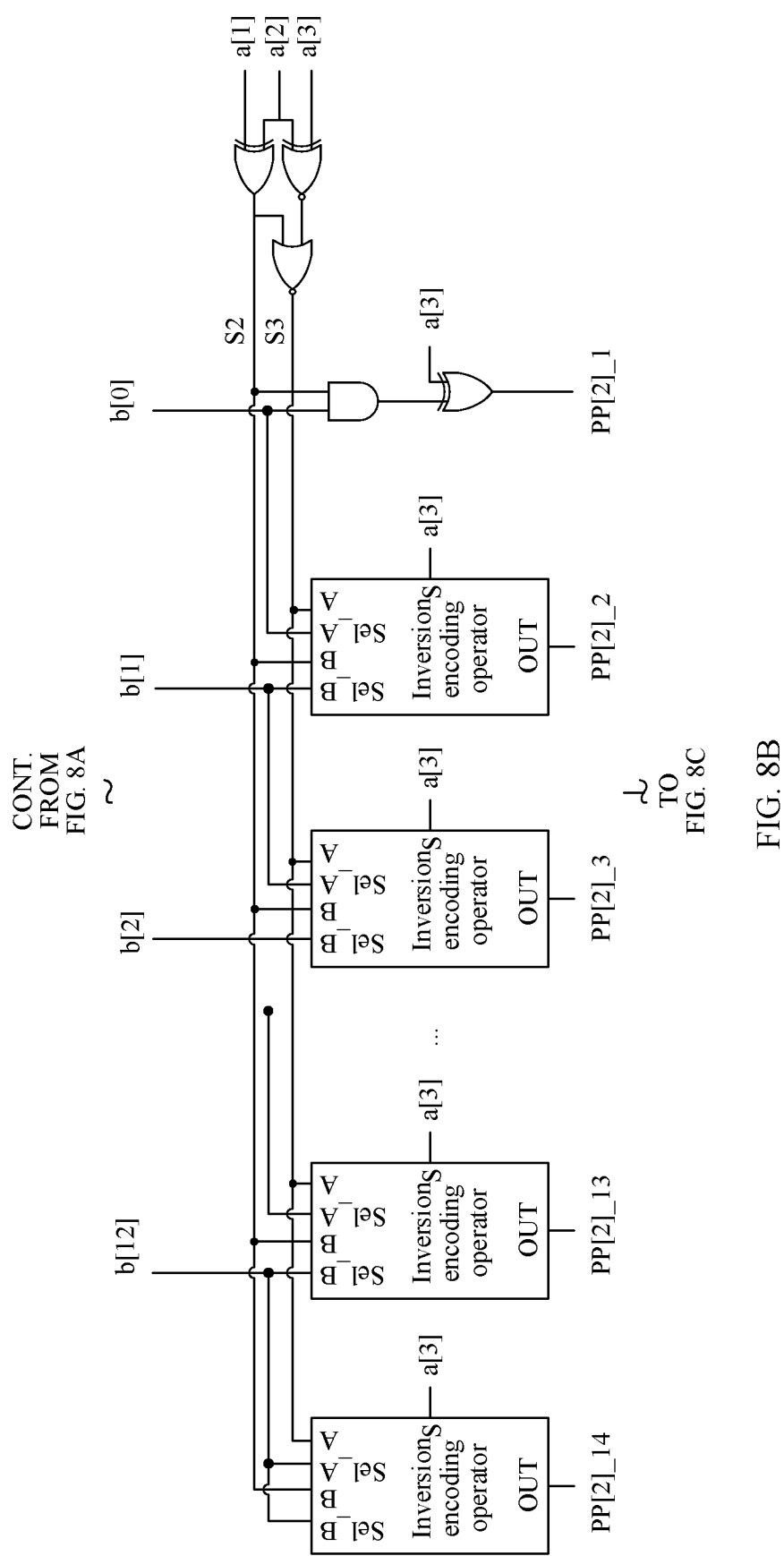
Figure 8C:
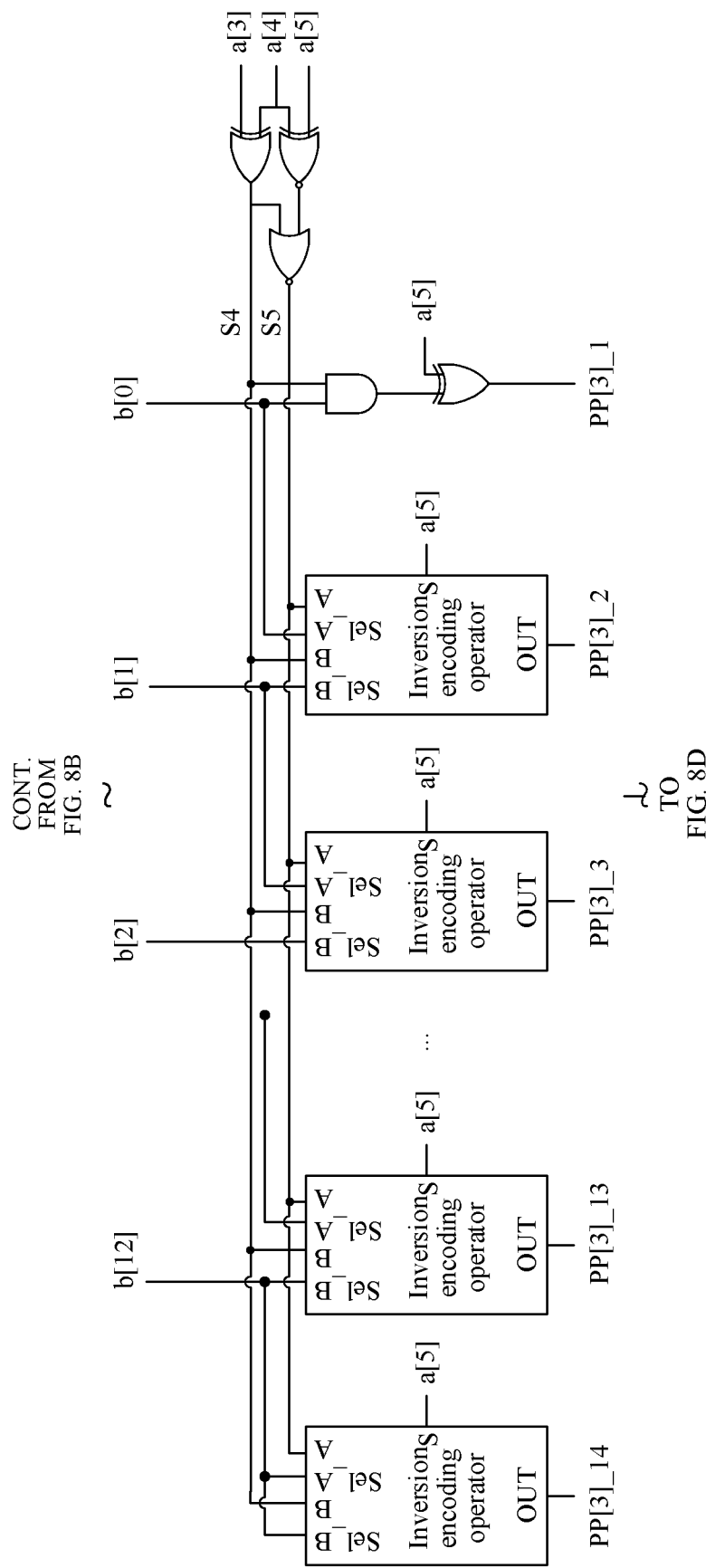
Figure 8D:
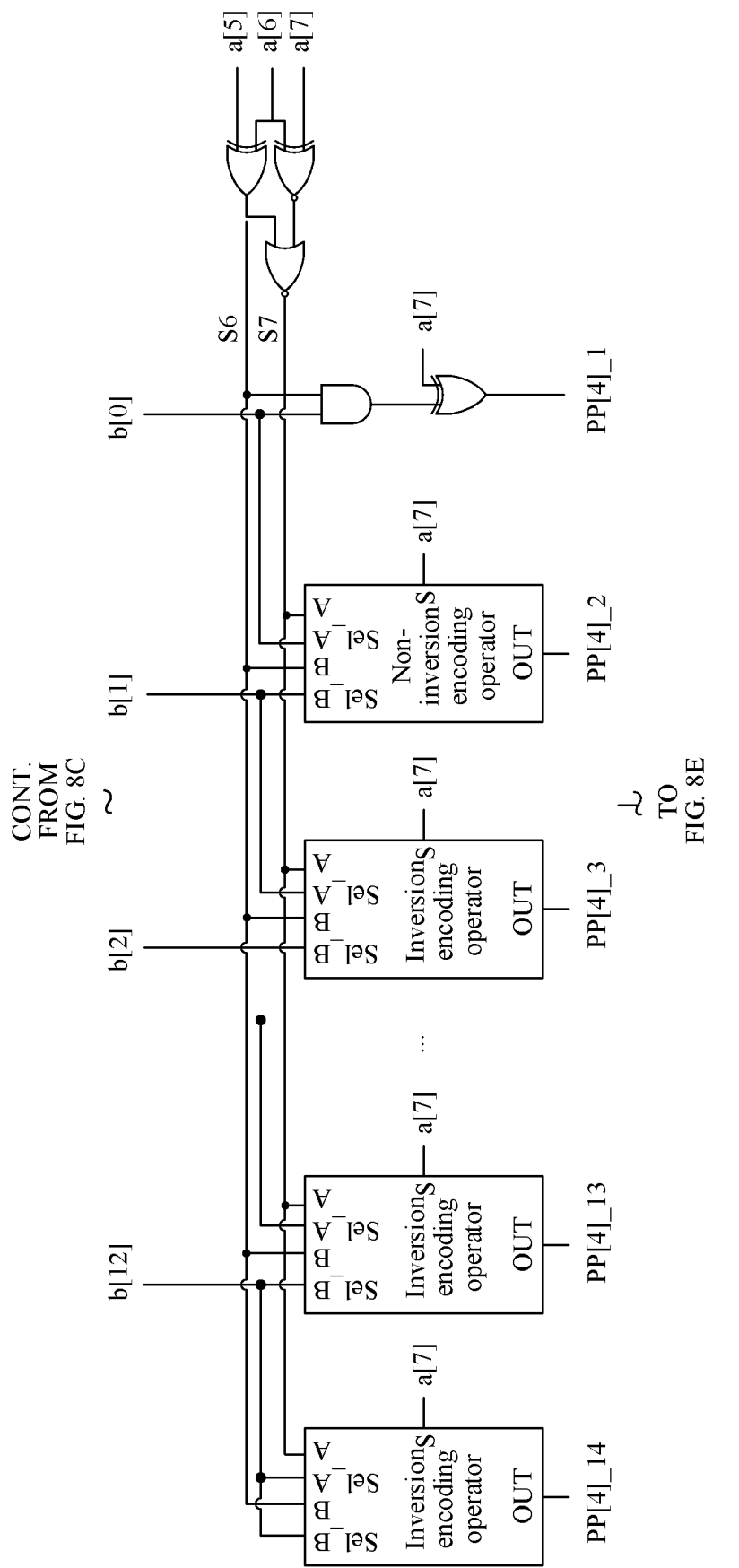
Figure 8E:
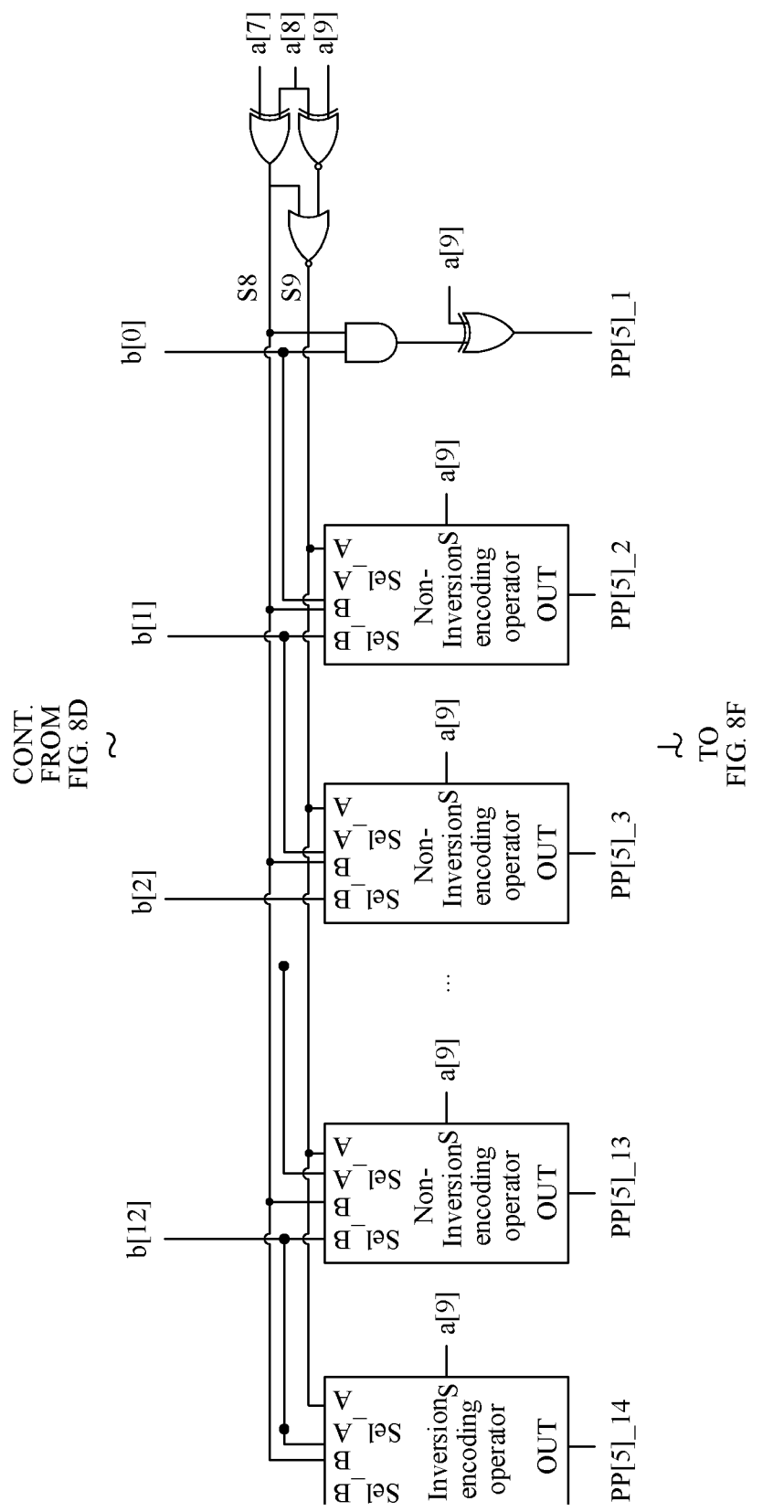
Figure 8F:
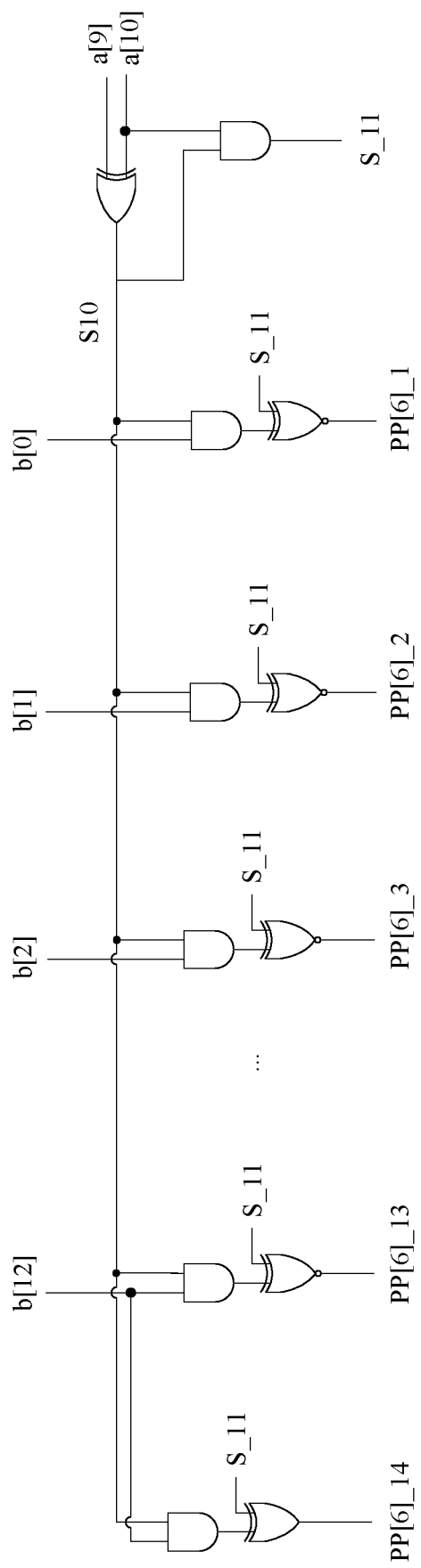

FIG. 7 is a logical block diagram of an inversion compressor 700 according to an embodiment of this application. The logical block diagram includes an inversion carry output unit 701 and an inversion sum output unit 704. A function of the inversion carry output unit 701 is if at least two of the inputs 705 Ai, Bi, and Ci are valid (1 or 0 may be valid), the output 707 is invalid (if 1 is valid, 0 is invalid; or if 0 is valid, 1 is invalid); otherwise, the output 707 is valid. A function of the inversion sum output unit 704 is if two of the inputs 705 Ai, Bi, Ci are invalid or all are invalid, the output 707 is valid; otherwise, the output 707 is invalid. When the input 706 nCip1 is inputted into the inversion sum output unit 707 is valid, it can be used to distinguish whether two of the inputs 705 Ai, Bi, and Ci are invalid or all of the inputs 705 Ai, Bi, and Ci are invalid. The inputs 705 Ai, Bi, and Ci in FIG. 7 represent three input bits, the input 706 nCip1 represents an output carry bit, and the output 707 nSi represents a current output sum bit. In other words, each layer of inversion compressors may perform compression based on a logical table shown in the following Table 3, where Ai, Bi, and Ci in Table 3 represent the three input bits 705, nCip1 represents the output carry bit 706, and nSi represents the current output sum bit 707.

TABLE 3

| Ai | Bi | Ci | nCip1 | nSi |
|---|---|---|---|---|
| 0 | 0 | 0 | 1 | 1 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 0 | 0 |

The multiplier may further include one or more inverters configured to invert phases of a current output sum bit and an output carry bit output by one or more inversion compressors in the W layers of inversion compressors 303, or invert a phase of at least one of the three bits input to one or more inversion compressors.

The W layers of inversion compressors 303 may include a plurality of layers of inversion compressors, and each layer of the plurality of layers of inversion compressors may include at least one inversion compressor. An output phase of each inversion compressor may be set based on a requirement, and the output phase of each inversion compressor is opposite to an input phase, so that the input phase of each inversion compressor is also set.

It should be noted that an output phase of an inversion compressor may be phases of a current output sum bit and an output carry bit output by the inversion compressor, and the phases of the current output sum bit and the output carry bit are the same, that is, both phases are positive or both phases are negative. An input phase of an inversion compressor may be configured phases of three bits input to the inversion compressor, and the configured phases of the three bits are the same, that is, are all positive or negative.

When an output phase of one or more inversion compressors in the W layers of inversion compressors 303 is different from a configured output phase, the one or more inverters are configured to invert phases of the current output sum bit and the output carry bit output by the one or more inversion compressors so that the phases are consistent with the configured output phase. Similarly, when a phase of at least one of the three bits input to the one or more inversion compressors is different from a configured input phase, the one or more inverters are configured to invert the phase of the at least one of the three bits input to the one or more inversion compressors so that the phase is consistent with the configured input phase.

In an implementation, an output phase of at least one inversion compressor included in each layer of inversion compressors may be set in the following manner: An output phase of a last layer of inversion compressors is set to positive, an output phase of a second-to-last layer of inversion compressors is set to negative, an output phase of a third-to-last layer of inversion compressors is set to positive, . . . , and so on until an output phase of a first layer of inversion compressors is set. The first layer of inversion compressors herein may refer to an uppermost layer of inversion compressors that compress a plurality of bits corresponding to each digit weight in a top-down order, a second layer of inversion compressors may refer to a next upper layer of inversion compressors, and so on. For example, if the W layers of inversion compressors 303 include four layers of inversion compressors, an output phase may be set in the following manner: An output phase of a fourth layer of inversion compressors is set to positive, an output phase of a third layer of inversion compressors is set to negative, an output phase of a second layer of inversion compressors is set to positive, and an output phase of a first layer of inversion compressors is set to negative.

Optionally, when an output phase of an inversion compressor is inconsistent with a configured output phase, or an input phase of an inversion compressor is inconsistent with a configured input phase; and at least three inverters need to perform inversion to meet requirements of the configured output phase and the configured input phase, the setting of the output phase of the inversion compressor may be partially adjusted to reduce a quantity of required inverters. For example, when a set output phase of an inversion compressor is positive (in this case, an input phase of the inversion compressor is negative), if an output phase of the inversion compressor is positive and phases of three bits input to the inversion compressor are also positive, the inversion compressor needs three inverters to invert the phases of the three bits so that requirements of the configured output phase and the configured input phase can be met. In this case, by resetting the output phase of the inversion compressor to negative (in this case, the input phase of the inversion compressor is positive), the inversion compressor needs only two inverters to invert output phases of two output bits (namely, a current output sum bit and an output carry bit), so that the requirements of the configured output phase and the configured input phase can be met.

Further, a phase of an encoding operator used by at least one encoder in the P groups of encoders 302 is related to a phase of the current output sum bit or the output carry bit output by at least one layer of inversion compressors in the W layers of inversion compressors 303. Optionally, a phase of an encoding operator used by each of the at least one encoder is set to be the same as an input phase of an inversion compressor connected to the encoder. The phase of the encoding operator used by each encoder may be positive or negative. When a phase of an encoding operator used by an encoder is positive (that is, a non-inversion encoding operator is used), the encoder may be the non-inversion encoder. When a phase of an encoding operator used by an encoder is negative (that is, an inversion encoding operator is used), the encoder may be the inversion encoder.

The adder 304 of FIG. 3 is configured to receive the two accumulated values and sum up the two accumulated values to obtain the product. After the W layers of inversion compressors 303 compress the P partial products to obtain the two accumulated values, the W layers of inversion compressors 303 may send the two accumulated values to the adder 304. When receiving the two accumulated values, the adder 304 sums up the two accumulated values to obtain the product of the first value and the second value.

For ease of understanding, the following describes the multiplier in this application by using an example in which the first value is a[10:0] and the second value is b[12:0]. As shown in FIG. 8A to FIG. 8F, the multiplier may include six precoders, six groups of encoders, and three layers of inversion compressors.

Figure 9:
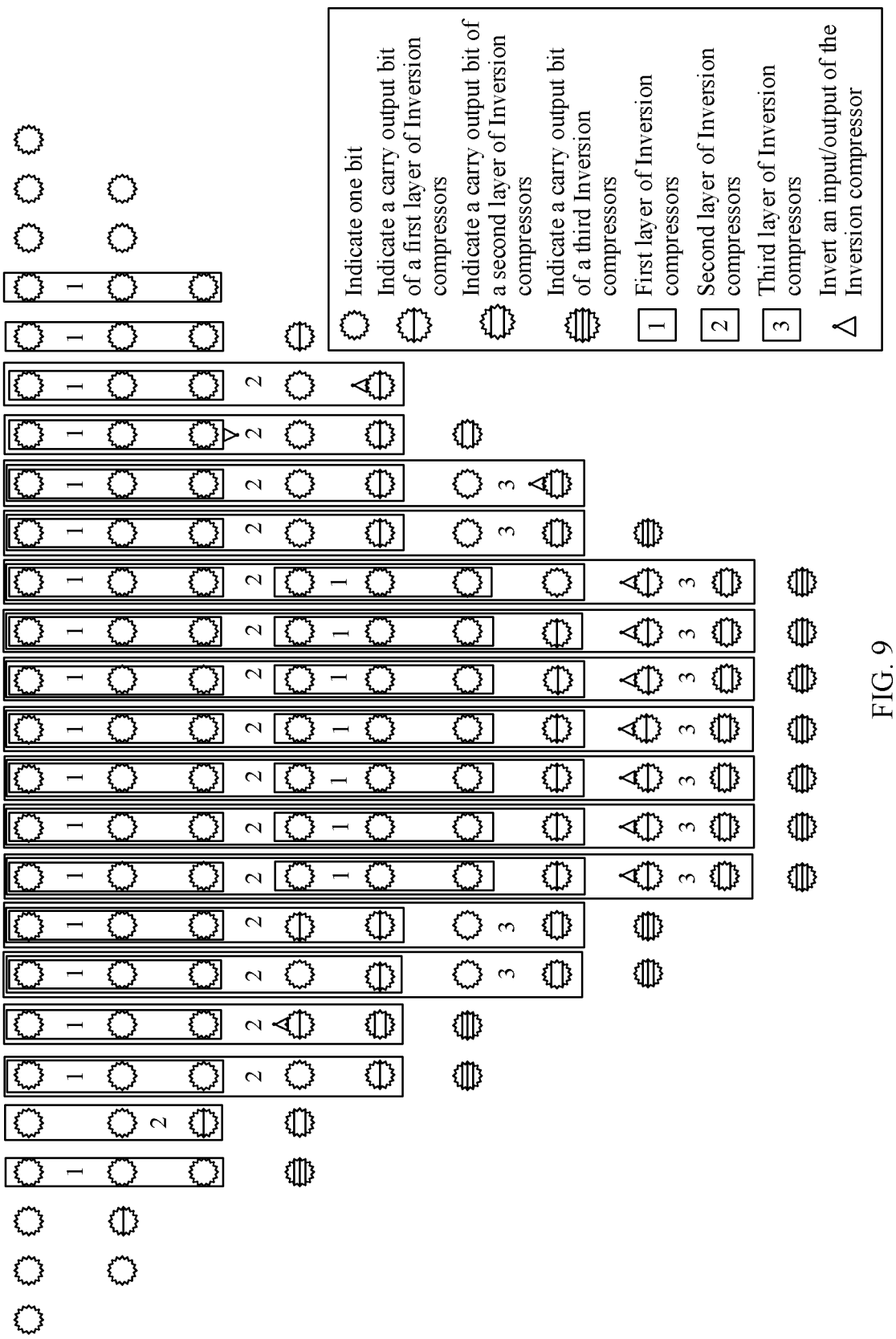
FIG. 9 is a diagram of another compression example of W layers of inversion compressors according to an embodiment of this application.

A first precoder is configured to generate group selection signals S0 and S1 and a symbol control input signal a[1] based on a[0] and a[1]. A second precoder is configured to generate group selection signals S2 and S3 and a symbol control input signal a[3] based on a[1], a[2], and a[3]. A third precoder is configured to generate group selection signals S4 and S5 and a symbol control input signal a[5] based on a[3], a[4], and a[5]. A fourth precoder is configured to generate group selection signals S6 and S7 and a symbol control input signal a[7] based on a[5], a[6], and a[7]. A fifth precoder is configured to generate group selection signals S8 and S9 and a symbol control input signal a[9] based on a[7], a[8], and a[9]. A sixth precoder is configured to generate a group selection signal S10 and a symbol control input signal S_11 based on a[9] and a[10]. Correspondingly, a first group of encoders are configured to encode b[12:0], S0, S1, and a[1], to obtain a first partial product PP[1]. A second group of encoders are configured to encode b[12:0], S2, S3, and a[3], to obtain a second partial product PP[2]. A third group of encoders are configured to encode b[12:0], S4, S5, and a[5], to obtain a third partial product PP[3]. A fourth group of encoders are configured to encode b[12:0], S6, S7, and a[7], to obtain a fourth partial product PP[4]. A fifth group of encoders are configured to encode b[12:0], S8, S9, and a[9], to obtain a fifth partial product PP[5]. A sixth group of encoders are configured to encode b[12:0], S10, and S_11, to obtain a sixth partial product PP[6]. Each encoder in each group of encoders is separately configured to encode 1 bit or 2 bits in b[12:0], a corresponding group selection signal, and a corresponding symbol control input signal. For details, refer to FIG. 8A to FIG. 8F. Finally, a matrix corresponding to the six partial products PP[1] to PP[6] may be shown in FIG. 9. According to the related descriptions of the W layers of inversion compressors 303 in the multiplier, the matrix shown in FIG. 9 may be compressed by the three layers of inversion compressors. A detailed compression process is similar to the related descriptions in FIG. 6A to FIG. 6D, and details are not described herein again in this embodiment of this application.

In the multiplier provided in this embodiment of this application, the P precoders may include precoders having different structures. For example, in FIG. 8A to FIG. 8F, a first precoder includes a NOT gate and an AND gate, a second precoder to a fifth precoder respectively include an XOR gate, an XNOR gate, and a NOR gate, and a sixth precoder includes an XOR gate and an AND gate. In addition, in this embodiment of this application, a first encoder may have a different structure from that of another encoder in a same group of encoders, and structures of encoders in different groups may also be different. For example, in a first group to a fifth group of encoders in FIG. 8A to FIG. 8E, a first encoder includes an AND gate and an XOR gate, and a second encoder to a thirteenth encoder each are a non-inversion encoder or an inversion encoder. Each encoder in a sixth group of encoders in FIG. 8F includes an AND gate and an XNOR gate.

It should be noted that PP[1]_i (a value of i ranges from 1 to 14) in FIG. 8A to FIG. 8F represents an $i^{th}$ bit in a first partial product PP[1], A represents a first signal, B represents a second signal, Sel_A represents a first bit, and Sel_B represents a second bit, S represents a symbol control input signal, and OUT represents an output bit.

Figure 10:
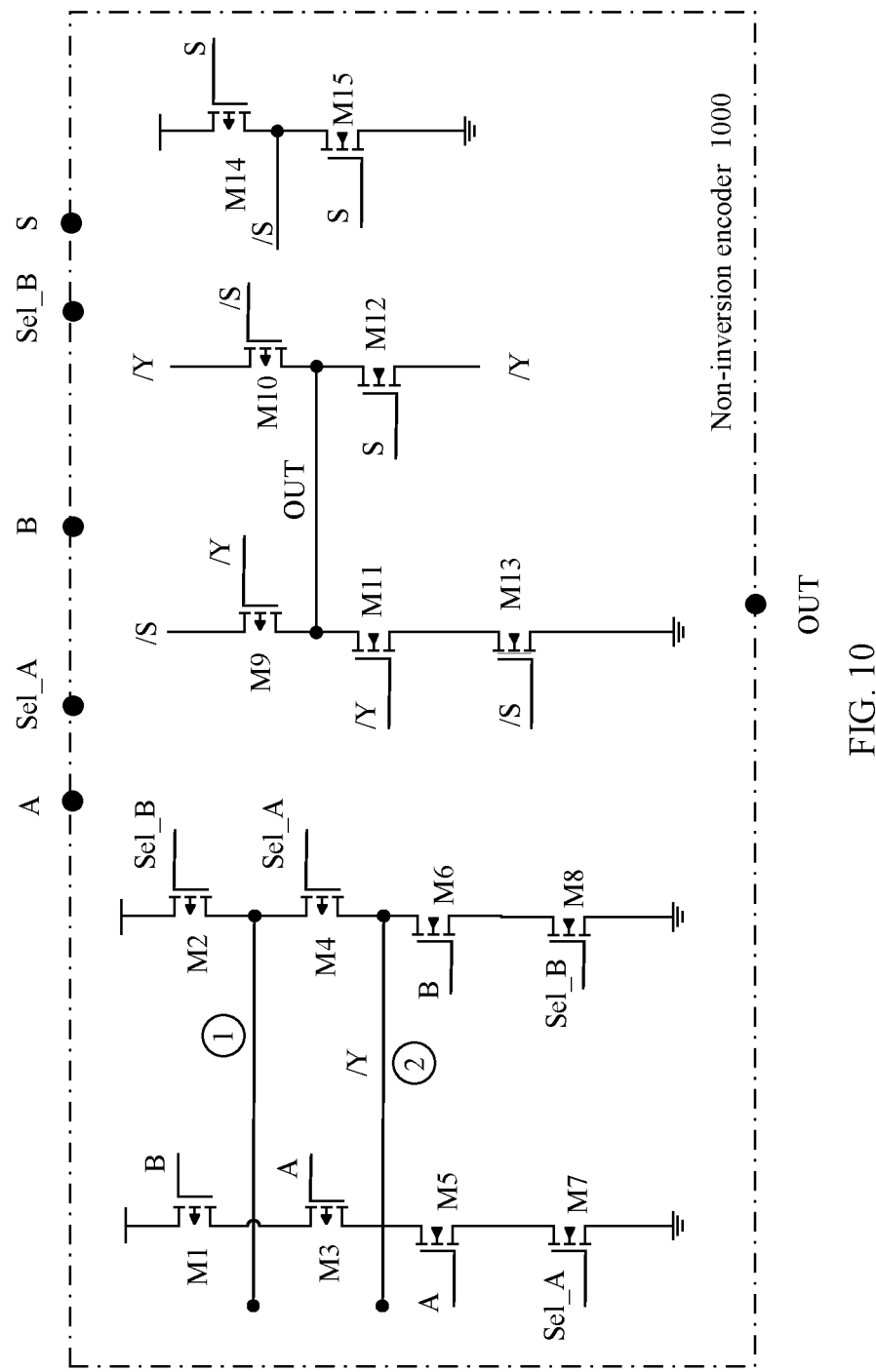
FIG. 10 is a diagram of a non-inversion encoder according to an embodiment of this application.

FIG. 10 is a diagram of a structure of a non-inversion encoding operator circuit 1000 according to an embodiment of this application. The non-inversion encoding operator circuit 1000 may also be referred to as a non-inversion encoder. The non-inversion encoder 1000 includes: a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a fourteenth transistor M14, and a fifteenth transistor M15.

The first transistor M1 and the second transistor M2 are coupled in parallel between a power supply terminal and a first node ①, the third transistor M3 and the fourth transistor M4 are coupled in parallel between the first node ① and a second node ②, the fifth transistor M5 and the seventh transistor M7 are coupled in series between the second node ② and a ground terminal, and the sixth transistor M6 and the eighth transistor M8 are coupled in series between the second node ② and the ground terminal. Control terminals of the third transistor M3 and the fifth transistor M5 are configured to receive a first input A, control terminals of the first transistor M1 and the sixth transistor M6 are configured to receive a second input Sel_A, control terminals of the fourth transistor M4 and the seventh transistor M7 are configured to receive a third input B, and control terminals of the second transistor M2 and the eighth transistor M8 are configured to receive a fourth input Sel_B.

The ninth transistor M9 is coupled between an inversion /S of a fifth input S and an output terminal OUT, a control terminal of the ninth transistor M9 is coupled to the second node ②, and a signal of the second node ② is /Y. The tenth transistor M10 is coupled between the second node ② and the output terminal OUT, and a control terminal of the tenth transistor M10 is coupled to the inversion /S of the fifth input S. The eleventh transistor M11 and the thirteenth transistor M13 are coupled in series between the output terminal OUT and the ground terminal. A control terminal of the eleventh transistor M11 is coupled to the second node . A control terminal of the thirteenth transistor M13 is configured to receive the inversion /S of the fifth input S. The twelfth transistor M12 is coupled between the output terminal OUT and the second node ②, and a control terminal of the twelfth transistor M12 is configured to receive the fifth input S. The fourteenth transistor M14 and the fifteenth transistor M15 are coupled in series between the power supply terminal and the ground terminal, and a series coupled node between the fourteenth transistor M14 and the fifteenth transistor M15 is coupled to the inversion /S of the fifth input S. Control terminals of the fourteenth transistor M14 and the fifteenth transistor M15 are configured to receive the fifth input S.

In this embodiment of this application, the first input A to the fifth input S may be respectively the first signal, the first bit, the second signal, the second bit, and the symbol control input signal in related descriptions of the non-inversion encoder in the foregoing embodiment of the multiplier.

Optionally, the first transistor M1, the second transistor M2, the third transistor M3, the fourth transistor M4, the ninth transistor M9, the tenth transistor M10, and the fourteenth transistor M14 are PMOS transistors. The fifth transistor M5, the sixth transistor M6, the seventh transistor M7, the eighth transistor M8, the eleventh transistor M11, the twelfth transistor M12, the thirteenth transistor M13, and the fifteenth transistor M15 are NMOS transistors. Correspondingly, the control terminal may refer to a gate of a corresponding PMOS transistor or an NMOS transistor.

It should be noted that the first transistor M1 to the fifteenth transistor M15 in the foregoing examples may be MOS transistors, or may be replaced by bipolar junction transistors. Types of the transistors shown in FIG. 10 are merely examples, and do not constitute a limitation on the embodiments of this application.

Figure 11:
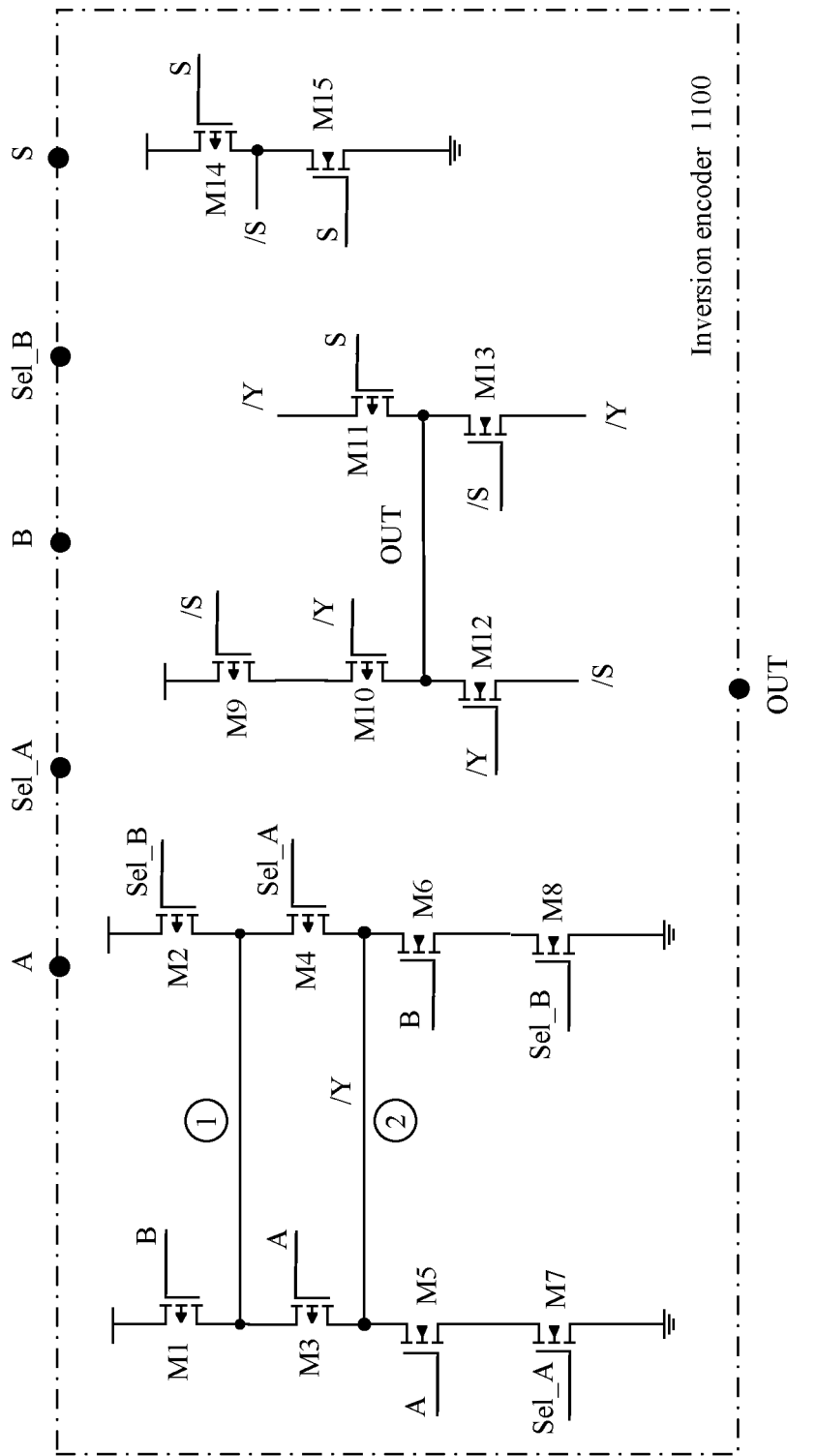
FIG. 11 is a diagram of an inversion encoder according to an embodiment of this application.

FIG. 11 is a diagram of a structure of an inversion encoding operator circuit 1100 according to an embodiment of this application. The inversion encoding operator circuit 1100 may also be referred to as an inversion encoder. The inversion encoder 1100 includes: a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, an eleventh transistor M11, a twelfth transistor M12, a thirteenth transistor M13, a fourteenth transistor M14, and a fifteenth transistor M15.

The first transistor M1 and the second transistor M2 are coupled in parallel between a power supply terminal and a first node ①, the third transistor M3 and the fourth transistor M4 are coupled in parallel between the first node ① and a second node ②, the fifth transistor M5 and the seventh transistor M7 are coupled in series between the second node ② and a ground terminal, and the sixth transistor M6 and the eighth transistor M8 are coupled in series between the second node ② and the ground terminal. Control terminals of the third transistor M3 and the fifth transistor M5 are configured to receive a first input A, control terminals of the first transistor M1 and the sixth transistor M6 are configured to receive a second input Sel_A, control terminals of the fourth transistor M4 and the seventh transistor M7 are configured to receive a third input B, and control terminals of the second transistor M2 and the eighth transistor M8 are configured to receive a fourth input Sel_B.

The ninth transistor M9 and the tenth transistor M10 are coupled in series between the power supply terminal and an output terminal OUT, a control terminal of the ninth transistor M9 is coupled to an inversion /S of a fifth input S, a control terminal of the tenth transistor M10 is coupled to the second node ②, and a signal of the second node ② is /Y. The eleventh transistor M11 is coupled between the second node ② and the output terminal OUT, and a control terminal of the eleventh transistor M11 is coupled to the fifth input S. The twelfth transistor M12 is coupled between the output terminal OUT and the inversion /S of the fifth input S, and a control terminal of the twelfth transistor M12 is coupled to the second node ②. The thirteenth transistor M13 is coupled between the output terminal OUT and the second node ②, and a control terminal of the thirteenth transistor M13 is coupled to the inversion /S of the fifth input S. The fourteenth transistor M14 and the fifteenth transistor M15 are coupled in series between the power supply terminal and the ground terminal, and a series coupled node between the fourteenth transistor M14 and the fifteenth transistor M15 is coupled to the inversion /S of the fifth input S. Control terminals of the fourteenth transistor M14 and the fifteenth transistor M15 are configured to receive the fifth input S.

In this embodiment of this application, the first input A to the fifth input S may be respectively the first signal, the first bit, the second signal, the second bit, and the symbol control input signal in related descriptions of the inversion encoder in the foregoing embodiment of the multiplier.

Optionally, the first transistor M1, the second transistor M2, the third transistor M3, the fourth transistor M4, the ninth transistor M9, the tenth transistor M10, the eleventh transistor M11, and the fourteenth transistor M14 are PMOS transistors. The fifth transistor M5, the sixth transistor M6, the seventh transistor M7, the eighth transistor M8, the twelfth transistor M12, the thirteenth transistor M13, and the fifteenth transistor M15 are NMOS transistors. Correspondingly, the control terminal may refer to a gate of a corresponding PMOS transistor or an NMOS transistor.

It should be noted that the first transistor M1 to the fifteenth transistor M15 in the foregoing examples may be MOS transistors, or may be replaced by bipolar junction transistors. Types of the transistors shown in FIG. 11 are merely examples, and do not constitute a limitation on the embodiments of this application.

Figure 12:
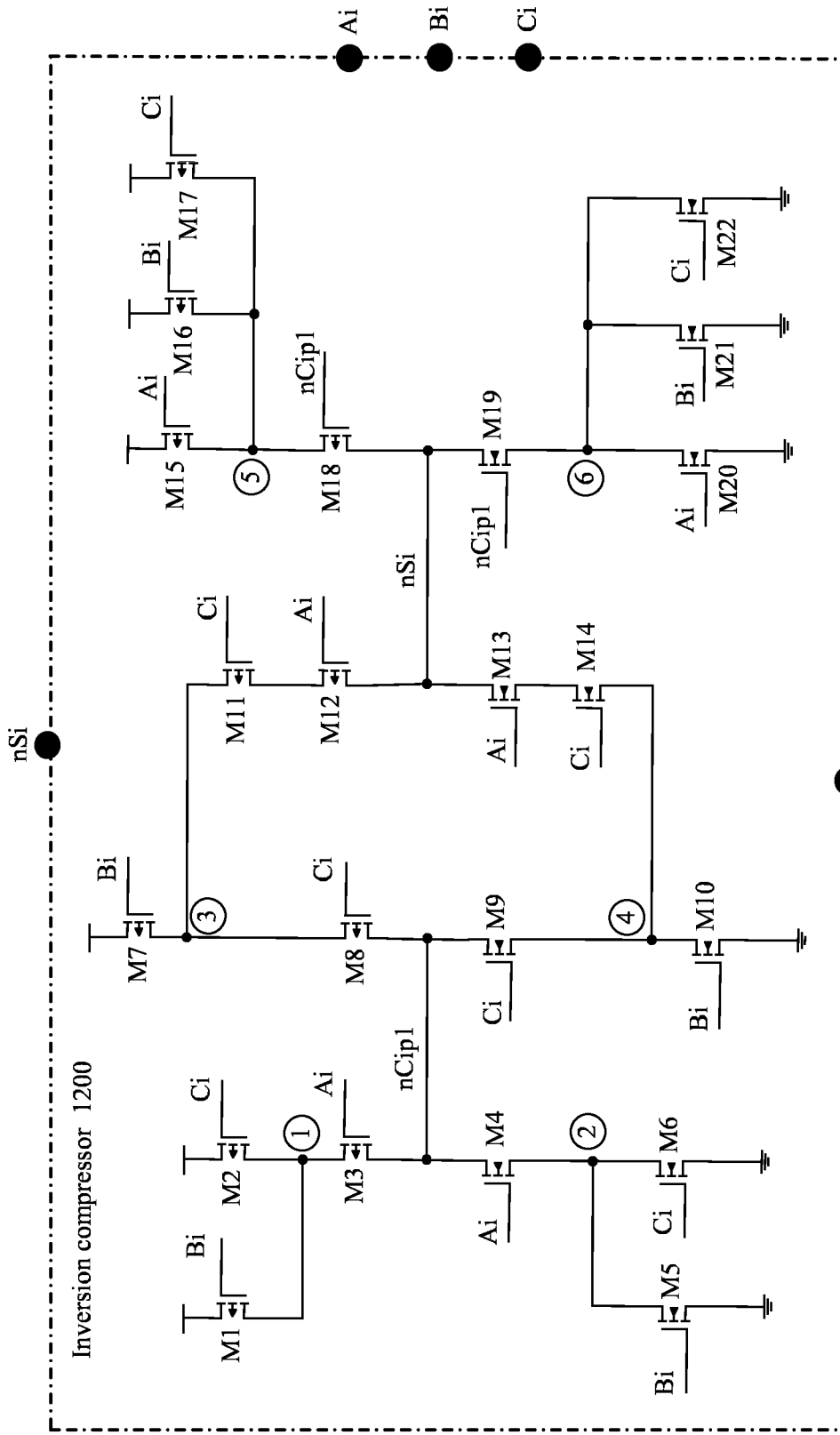
FIG. 12 is a diagram of an inversion compressor according to an embodiment of this application.

FIG. 12 is a diagram of a structure of an inversion compression operator circuit 1200 according to an embodiment of this application. The inversion compression operator circuit 1200 may also be referred to as an inversion compressor. The inversion compressor includes a first transistor M1, a second transistor M2, a third transistor M3, a fourth transistor M4, a fifth transistor M5, a sixth transistor M6, a seventh transistor M7, an eighth transistor M8, a ninth transistor M9, a tenth transistor M10, and an eleventh transistor M11, a twelfth transistor M12, a thirteenth transistor M13, a fourteenth transistor M14, a fifteenth transistor M15, a sixteenth transistor M16, a seventeenth transistor M17, an eighteenth transistor M18, a nineteenth transistor M19, a twentieth transistor M20, a twenty-first transistor M21, and a twenty-second transistor M22.

The first transistor M1 and the second transistor M2 are coupled in parallel between a power supply terminal and a first node ①, the third transistor M3 is coupled between the first node ① and a first output terminal nCip1, and the fourth transistor M4 is coupled between the first output terminal nCip1 and a second node ②. The fifth transistor M5 and the sixth transistor M6 are coupled in parallel between the second node ② and a ground terminal, the seventh transistor M7 is coupled between the power supply terminal and a third node ③, the eighth transistor M8 is coupled between the third node ③ and the first output terminal nCip1, and the ninth transistor M9 is coupled between the first output terminal nCip1 and a fourth node ④. The tenth transistor M10 is coupled between the fourth node and the ground terminal, the eleventh transistor M11 and the twelfth transistor M12 are coupled in series between the third node ③ and a second output terminal nSi, and the thirteenth transistor M13 and the fourteenth transistor M14 are coupled in series between the second output terminal nSi and the fourth node ④. The fifteenth transistor M15, the sixteenth transistor M16, and the seventeenth transistor M17 are coupled in parallel between the power supply terminal and a fifth node ⑤, the eighteenth transistor M18 is coupled between the fifth node ⑤ and the second output terminal nSi, the nineteenth transistor M19 is coupled between the second output terminal nSi and a sixth node ⑥, and the twentieth transistor M20, the twenty-first transistor M21, and the twenty-second transistor M22 are coupled in parallel between the sixth node ⑥ and the ground terminal.

Control terminals of the third transistor M3, the fourth transistor M4, the twelfth transistor M12, the thirteenth transistor M13, the fifteenth transistor M15, and the twentieth transistor M20 are configured to receive a first input Ai. Control terminals of the first transistor M1, the fifth transistor M5, the seventh transistor M7, the tenth transistor M10, the sixteenth transistor M16, and the twenty-first transistor M21 are configured to receive a second input Bi. Control terminals of the second transistor M2, the sixth transistor M6, the eighth transistor M8, the ninth transistor M9, the eleventh transistor M11, the fourteenth transistor M14, the seventeenth transistor M17, and the twenty-second transistor M22 are configured to receive a third input Ci. Control terminals of the eighteenth transistor M18 and the nineteenth transistor M19 are coupled to the first output terminal nCip1.

In this embodiment of this application, the first input Ai, the second input Bi, and the third input Ci may be the three bits in related descriptions of the inversion compressor in the foregoing embodiment of the multiplier. The first output terminal nCip1 is configured to output an output carry bit of the inversion compressor, and the second output terminal nSi is configured to output a current output sum bit of the inversion compressor.

Optionally, the first transistor M1, the second transistor M2, the third transistor M3, the seventh transistor M7, the eighth transistor M8, the eleventh transistor M11, the twelfth transistor M12, the fifteenth transistor M15, the sixteenth transistor M16, the seventeenth transistor M17, and the eighteenth transistor M18 are PMOS transistors. The fourth transistor M4, the fifth transistor M5, the sixth transistor M6, the ninth transistor M9, the tenth transistor M10, the thirteenth transistor M13, the fourteenth transistor M14, the nineteenth transistor M19, the twentieth transistor M20, the twenty-first transistor M21, and the twenty-second transistor M22 are NMOS transistors. Correspondingly, the control terminal may refer to a gate of a corresponding PMOS transistor or an NMOS transistor.

It should be noted that the first transistor M1 to the twenty-second transistor M22 in the foregoing examples may be MOS transistors, or may be replaced by bipolar junction transistors. Types of the transistors shown in FIG. 12 are merely examples, and do not constitute a limitation on the embodiments of this application.

In this embodiment of this application, a multiplier that uses the non-inversion encoder, the inversion encoder, and the inversion compressor provided above is compared with an existing multiplier that uses a standard encoder and a standard adder. Details are shown in Table 4 and Table 5. In an embodiment of this application, this embodiment is not limited to the following parameter values.

TABLE 4

|  | Encoding | | Compressing | |
| --- | --- | --- | --- | --- |
|  | Standard encoder | Non-inversion encoder or inversion encoder | Standard adder | Inversion compressor |
| Quantity of transistors | 22 | 15 | 28 | 24 |
| 7 nm process-based area (um$^2$) | 0.2736 | 0.23256 | 0.2736 | 0.24816 |
| Area proportion | 1.18 | 1 | 1.10 | 1 |
| Total area proportion | About 14% | | | |

It can be seen from Table 4 that each standard encoder uses a quantity 22 of transistors, occupies an area of 0.2736, and has an area proportion of 1.18, and each non-inversion encoder or inversion encoder uses a quantity 15 of transistors, occupies an area of 0.23256, and has an area proportion of 1. Each standard adder uses a quantity 28 of transistors, occupies an area of 0.2736, and has an area proportion of 1.10, and each inversion compressor uses a quantity 24 of transistors, occupies an area of 0.24816, and has an area proportion of 1. Therefore, an area of the multiplier provided in the embodiments of this application is smaller.

TABLE 5

|  |  | Encoding | | Compressing | |
| --- | --- | --- | --- | --- | --- |
|  |  | Standard encoder | Non-inversion encoder or inversion encoder | Standard adder | Inversion compressor |
| Toggle times per bit | | 4 | 3 | 4 | 2 |
| 7 nm process-based static power consumption (fJ@typical, 0.75 V, 85 C.) | | 0.44522@ 18 ps, 6 ff | 0.4084@ 18 ps, 6 ff | 0.57685@ 14 ps, 7 ff | 0.32122@ 14 ps, 7 ff |
| Power consumption proportion | Static power consumption | 1.18 | 1 | 1.10 | 1 |
| | Dynamic power consumption | 1.09 | 1 | 1.80 | 1 |
| Total power consumption proportion | | About >30% | | | |

It can be seen from Table 5 that the standard encoder toggles four times for encoding every 1 bit of data, and has a static power consumption of 0.44522, a static power consumption proportion of 1.18, and a dynamic power consumption proportion of 1.09. The non-inversion encoder or inversion encoder toggles three times for encoding every 1 bit of data, and has a static power consumption of 0.4084, and a static power consumption proportion and a dynamic power consumption proportion both of 1. The standard adder toggles four times for compressing every 1 bit of data, has a static power consumption of 0.57685, a static power consumption proportion of 1.10, and a dynamic power consumption proportion of 1.80. The inversion compressor toggles twice for compressing every 1 bit of data, has a static power consumption of 0.32122, and a static power consumption proportion and a dynamic power consumption proportion both of 1. Therefore, a power consumption of the multiplier provided in the embodiments of this application is lower.

The encoder in the multiplier provided in the embodiments of this application performs encoding by using a non-inversion encoding operator or an inversion encoding operator, that is, the multiplier performs encoding by using a non-inversion encoder or an inversion encoder. In addition, the compressor performs compression by using an inversion compressor. An implementation solution of the multiplier is simple. For example, a quantity of MOS transistors in a multiplier can be reduced, to reduce an area of the multiplier. In addition, a quantity of toggle times of a corresponding encoder or compressor is small when the multiplier encodes or compresses every 1 bit of data, so that power consumption of the multiplier is low.

Finally, it should be noted that the foregoing descriptions are merely implementations of the embodiments of this application, and are not intended to limit the protection scope of this application. Any variation or replacement within the technical scope disclosed in this application shall fall within the protection scope of this application. Therefore, the protection scope of this application shall be subject to the protection scope of the claims.

The invention claimed is:

1. A multiplier configured to implement multiplication of a first value of M bits and a second value of N bits, wherein M and N are integers greater than 1, the multiplier comprising:
    P groups of encoders, each encoder group of the P groups of encoders comprising N encoders, the each encoder group configured to encode a part of bits in the second value, a group selection signal, and a symbol control input signal, the symbol control input signal corresponding to the each encoder group using non-inversion encoding operators or inversion encoding operators to obtain one partial product, the group selection signal and the symbol control input signal being generated based on a part of bits in the first value, and the P groups of encoders performing encoding to obtain P partial products; and
    W layers of inversion compressors coupled to the P groups of encoders, each encoder group of the P groups of encoders comprising N encoders, W is a positive integer, and P is an integer greater than 1, the each encoder group configured to:
        encode a part of bits in the second value, a group selection signal, and a symbol control input signal, the symbol control input signal corresponding to the each encoder group, the encoding using non-inversion encoding operators or inversion encoding operators to obtain one partial product, the group selection signal and the symbol control input signal being generated based on a part of bits in the first value, and the P groups of encoders performing encoding to obtain P partial products; and
        compress the P partial products using inversion compression operators to obtain two accumulated values, a sum of the two accumulated values comprising a product of the first value and the second value.

2. The multiplier according to claim 1, wherein each encoder of the N encoders corresponds to a first bit and a second bit in the second value, the group selection signal comprises a first signal and a second signal, and the each encoder is configured to encode the first bit, the second bit, the group selection signal, and the symbol control input signal, the encoding using the non-inversion encoding operator or the inversion encoding operator to obtain one output bit in one partial product.

3. The multiplier according to claim 2, wherein the each encoder uses a non-inversion encoding operator and is configured to perform the following encoding operation:
    if both the first signal and the first bit are 1, or both the second signal and the second bit are 1, the output bit obtained by the encoder is an inversion of the symbol control input signal; or
    if at least one of the first signal and the first bit is 0, and at least one of the second signal and the second bit is 0, the output bit obtained by the encoder is the symbol control input signal.

4. The multiplier according to claim 2, wherein the each encoder uses an inversion encoding operator and is configured to perform the following encoding operation:
    if both the first signal and the first bit are 1, or both the second signal and the second bit are 1, the output bit obtained by the encoder is the symbol control input signal; or
    if at least one of the first signal and the first bit is 0, and at least one of the second signal and the second bit is 0, the output bit obtained by the encoder is an inversion of the symbol control input signal.

5. The multiplier according to claim 1, wherein W is 1 and the W layers of inversion compressors comprise a first layer of inversion compressors, wherein:
    the first layer of inversion compressors is configured to compress each digit weight in a matrix of the P partial products using the inversion compression operators in a sequence from a low digit weight to a high digit weight until a quantity of remaining bits corresponding to the each digit weight are less than three, to obtain a first compressed matrix comprising two rows, wherein each row corresponds to one accumulated value; and
    compression on the each digit weight is performed for every three bits on the digit weight, and in the matrix of the P partial products each row comprises one partial product and each column comprises a plurality of bits corresponding to a same digit weight in the P partial products.

6. The multiplier according to claim 1, wherein W is an integer greater than 1 and the W layers of inversion compressors comprise a first layer of inversion compressors to a $W^{th}$ layer of inversion compressors, wherein:
    the first layer of inversion compressors are configured to compress each digit weight in a matrix of the P partial products using the inversion compression operators in a sequence from a low digit weight to a high digit weight until a quantity of remaining bits corresponding to the each digit weight are less than three, to obtain a first compressed matrix;

an $i^{th}$ layer of inversion compressors are configured to compress the each digit weight in an $(i-1)^{th}$ compressed matrix using the inversion compression operators in a sequence from a low digit weight to a high digit weight until a quantity of remaining bits corresponding to the each digit weight are less than three, to obtain an $i^{th}$ compressed matrix, wherein a value of i ranges from 2 to W; and a $W^{th}$ compressed matrix comprises two rows, each row corresponding to an accumulated value of the two accumulated values;

wherein compression on the each digit weight by each layer of inversion compressors is performed for the three bits on the digit weight, and in the matrix of the P partial products, each row comprises one partial product and each column comprises a plurality of bits corresponding to a same digit weight in the P partial products.

7. The multiplier according to claim 5, wherein for the three bits on the each digit weight, each inversion compressor is configured to perform the following compression:

if the three bits are all 0, an output carry bit is 1 and a current output sum bit is 1;

if the three bits are all 1, an output carry bit is 0 and a current output sum bit is 0;

if one of the three bits is 1 and the other two bits are 0, an output carry bit is 1 and a current output sum bit is 0; or if two of the three bits are 1 and the other bit is 0, an output carry bit is 0 and a current output sum bit is 1.

8. The multiplier according to claim 7, wherein phases of encoding operators used by encoders corresponding to a same digit weight are related to a phase of the current output sum bit or the output carry bit output by the inversion compressor; and wherein the encoder corresponding to the same digit weight performs encoding to obtain an output bit corresponding to the same digit weight, and an inversion compressor corresponding to the same digit weight compresses the three bits on the same digit weight.

9. The multiplier according to claim 8, wherein the multiplier further comprises:

one or more inverters configured to invert phases of a current output sum bit and an output carry bit, the current output sum bit and the output carry bit being output by one or more inversion compressors in the W layers of inversion compressors, or invert a phase of at least one of the three bits input to the one or more inversion compressors.

10. The multiplier according to claim 1, wherein the multiplier further comprises:

a precoder configured to receive the first value and generate the group selection signal and the symbol control input signal based on the part of bits in the first value.

11. The multiplier according to claim 1, wherein the multiplier further comprises:

an adder configured to receive the two accumulated values and sum up the two accumulated values to obtain the product.

12. An operator circuit, comprising:

a first transistor and a second transistor are coupled in parallel between a power supply terminal and a first node;

a third transistor and a fourth transistor are coupled in parallel between the first node and a second node;

a fifth transistor and a seventh transistor are coupled in series between the second node and a ground terminal;

a sixth transistor and an eighth transistor are coupled in series between the second node and the ground terminal;

control terminals of the third transistor and the fifth transistor are configured to receive a first input;

control terminals of the first transistor and the sixth transistor are configured to receive a second input;

control terminals of the fourth transistor and the seventh transistor are configured to receive a third input;

control terminals of the second transistor and the eighth transistor are configured to receive a fourth input;

a ninth transistor is coupled between an inversion of a fifth input and an output terminal, and a control terminal of the ninth transistor is coupled to the second node;

a tenth transistor is coupled between the second node and the output terminal, and a control terminal of the tenth transistor is coupled to the inversion of the fifth input;

an eleventh transistor and a thirteenth transistor are coupled in series between the output terminal and the ground terminal;

a control terminal of the eleventh transistor is coupled to the second node;

a control terminal of the thirteenth transistor is configured to receive the inversion of the fifth input;

a twelfth transistor is coupled between the output terminal and the second node, and a control terminal of the twelfth transistor is configured to receive the fifth input;

a fourteenth transistor and a fifteenth transistor are coupled in series between the power supply terminal and the ground terminal, and a series coupled node between the fourteenth transistor and the fifteenth transistor is coupled to the inversion of the fifth input; and control terminals of the fourteenth transistor and the fifteenth transistor are configured to receive the fifth input.

13. The operator circuit according to claim 12, wherein the first transistor, the second transistor, the third transistor, the fourth transistor, the ninth transistor, the tenth transistor, and the fourteenth transistor are PMOS transistors; and the fifth transistor, the sixth transistor, the seventh transistor, the eighth transistor, the eleventh transistor, the twelfth transistor, the thirteenth transistor, and the fifteenth transistor are NMOS transistors.

14. An operator circuit, comprising:

a first transistor and a second transistor are coupled in parallel between a power supply terminal and a first node;

a third transistor and a fourth transistor are coupled in parallel between the first node and a second node;

a fifth transistor and a seventh transistor are coupled in series between the second node and a ground terminal;

a sixth transistor and an eighth transistor are coupled in series between the second node and the ground terminal;

control terminals of the third transistor and the fifth transistor are configured to receive a first input;

control terminals of the first transistor and the sixth transistor are configured to receive a second input;

control terminals of the fourth transistor and the seventh transistor are configured to receive a third input;

control terminals of the second transistor and the eighth transistor are configured to receive a fourth input;

a ninth transistor and a tenth transistor are coupled in series between the power supply terminal and an output terminal, a control terminal of the ninth transistor is coupled to an inversion of a fifth input, and a control terminal of the tenth transistor is coupled to the second node;

an eleventh transistor is coupled between the second node and the output terminal, and a control terminal of the eleventh transistor is coupled to the fifth input;

a twelfth transistor is coupled between the output terminal and the inversion of the fifth input, and a control terminal of the twelfth transistor is coupled to the second node;

a thirteenth transistor is coupled between the output terminal and the second node, and a control terminal of the thirteenth transistor is coupled to the inversion of the fifth input;

a fourteenth transistor and a fifteenth transistor are coupled in series between the power supply terminal and the ground terminal, and a series coupled node between the fourteenth transistor and the fifteenth transistor is coupled to the inversion of the fifth input; and control terminals of the fourteenth transistor and the fifteenth transistor are configured to receive the fifth input.

15. The operator circuit according to claim 14, wherein the first transistor, the second transistor, the third transistor, the fourth transistor, the ninth transistor, the tenth transistor, the eleventh transistor, and the fourteenth transistor are PMOS transistors; and the fifth transistor, the sixth transistor, the seventh transistor, the eighth transistor, the twelfth transistor, the thirteenth transistor, and the fifteenth transistor are NMOS transistors.

16. An operator circuit, comprising:
a first transistor and a second transistor are coupled in parallel between a power supply terminal and a first node;

a third transistor is coupled between the first node and a first output terminal;

a fourth transistor is coupled between the first output terminal and a second node;

a fifth transistor and a sixth transistor are coupled in parallel between the second node and a ground terminal;

a seventh transistor is coupled between the power supply terminal and a third node;

an eighth transistor is coupled between the third node and the first output terminal;

a ninth transistor is coupled between the first output terminal and a fourth node;

a tenth transistor is coupled between the fourth node and the ground terminal;

an eleventh transistor and a twelfth transistor are coupled in series between the third node and a second output terminal;

a thirteenth transistor and a fourteenth transistor are coupled in series between the second output terminal and the fourth node;

a fifteenth transistor, a sixteenth transistor, and a seventeenth transistor are coupled in parallel between the power supply terminal and a fifth node;

an eighteenth transistor is coupled between the fifth node and the second output terminal;

a nineteenth transistor is coupled between the second output terminal and a sixth node;

a twentieth transistor, a twenty-first transistor, and a twenty-second transistor are coupled in parallel between the sixth node and the ground terminal;

control terminals of the third transistor, the fourth transistor, the twelfth transistor, the thirteenth transistor, the fifteenth transistor, and the twentieth transistor are configured to receive a first input;

control terminals of the first transistor, the fifth transistor, the seventh transistor, the tenth transistor, the sixteenth transistor, and the twenty-first transistor are configured to receive a second input;

control terminals of the second transistor, the sixth transistor, the eighth transistor, the ninth transistor, the eleventh transistor, the fourteenth transistor, the seventeenth transistor, and the twenty-second transistor are configured to receive a third input; and control terminals of the eighteenth transistor and the nineteenth transistor are coupled to the first output terminal.

17. The operator circuit according to claim 16, wherein the first transistor, the second transistor, the third transistor, the seventh transistor, the eighth transistor, the eleventh transistor, the twelfth transistor, the fifteenth transistor, the sixteenth transistor, the seventeenth transistor, and the eighteenth transistor are PMOS transistors; and the fourth transistor, the fifth transistor, the sixth transistor, the ninth transistor, the tenth transistor, the thirteenth transistor, the fourteenth transistor, the nineteenth transistor, the twentieth transistor, the twenty-first transistor, and the twenty-second transistor are NMOS transistors.

18. An inversion compressor, comprising:
W layers of inversion compressors, W being an integer greater than 1, the W layers of inversion compressors comprise a first layer of inversion compressors to a $W^{th}$ layer of inversion compressors;

wherein the first layer of inversion compressors are configured to compress each digit weight in a matrix of P partial products using inversion compression operators in a sequence from a low digit weight to a high digit weight until a quantity of remaining bits corresponding to the each digit weight are less than three, to obtain a first compressed matrix;

an $i^{th}$ layer of inversion compressors are configured to compress the each digit weight in an $(i-1)^{th}$ compressed matrix using the inversion compression operators in a sequence from a low digit weight to a high digit weight until a quantity of remaining bits corresponding to the each digit weight are less than three, to obtain an $i^{th}$ compressed matrix, wherein a value of i ranges from 2 to W; and a $W^{th}$ compressed matrix comprises two rows and each row corresponds to one accumulated value;

wherein compression on the each digit weight by each layer of inversion compressors is performed for the three bits on the digit weight, and in the matrix of the P partial products each row comprises one partial product and each column comprises a plurality of bits corresponding to a same digit weight in the P partial products.

19. The W layers of inversion compressors according to claim 18, wherein for the three bits on the each digit weight, each inversion compressor is configured to perform the following compression:
if the three bits are all 0, an output carry bit is 1 and a current output sum bit is 1;

if the three bits are all 1, an output carry bit is 0 and a current output sum bit is 0;

if one of the three bits is 1 and the other two bits are 0, an output carry bit is 1 and a current output sum bit is 0; or if two of the three bits are 1 and the other bit is 0, an output carry bit is 0 and a current output sum bit is 1.

20. The W layers of inversion compressors according to claim 18, wherein the W layers of inversion compressors further comprise:

one or more inverters configured to invert phases of a current output sum bit and an output carry bit that are output by one or more inversion compressors in the W layers of inversion compressors, or invert a phase of at least one of the three bits input to the one or more inversion compressors.

* * * * *